US006423469B1

(12) United States Patent
DoMinh et al.

(10) Patent No.: US 6,423,469 B1
(45) Date of Patent: *Jul. 23, 2002

(54) THERMAL SWITCHABLE COMPOSITION AND IMAGING MEMBER CONTAINING OXONOL IR DYE AND METHODS OF IMAGING AND PRINTING

(75) Inventors: Thap DoMinh, Webster; Shiying Zheng; Kevin W. Williams, both of Rochester, all of NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/444,695

(22) Filed: Nov. 22, 1999

(51) Int. Cl.[7] ............................................... G03F 7/038

(52) U.S. Cl. ................................ 430/270.1; 430/278.1; 430/303; 430/281.1

(58) Field of Search ............................. 430/270.1, 302, 430/303, 271.1, 278.1; 8/654–688

(56) References Cited

U.S. PATENT DOCUMENTS

| | | | | | |
|---|---|---|---|---|---|
| 4,034,183 | A | | 7/1977 | Uhlig | 219/122 |
| 4,081,572 | A | | 3/1978 | Pacamsky | 427/53 |
| 4,405,705 | A | | 9/1983 | Etoh et al. | 430/270 |
| 4,548,893 | A | | 10/1985 | Lee et al. | 430/296 |
| 4,634,659 | A | | 1/1987 | Esumi et al. | 430/302 |
| 5,213,956 | A | | 5/1993 | Diehl et al. | 430/522 |
| 5,399,690 | A | * | 3/1995 | Diehl et al. | 544/301 |
| 5,512,418 | A | | 4/1996 | Ma | 430/271.1 |
| 5,985,514 | A | * | 11/1999 | Zheng et al. | 430/270.1 |
| 6,060,218 | A | * | 5/2000 | Van Damme et al. | 430/302 |
| 6,083,663 | A | * | 7/2000 | Vermeersch et al. | 430/302 |
| 6,136,503 | A | * | 10/2000 | Zheng et al. | 430/270.1 |
| 6,159,657 | A | * | 12/2000 | Fleming et al. | 430/270.1 |
| 6,162,578 | A | * | 12/2000 | Zheng et al. | 430/270.1 |
| 6,051,361 | A1 | * | 4/2001 | Hattori et al. | 430/270.1 |
| 6,235,451 | B1 | * | 5/2001 | Damme et al. | 430/302 |
| 6,238,838 | B1 | * | 5/2001 | Gaschler et al. | 430/278.1 |
| 6,248,503 | B1 | * | 6/2001 | Vermeersch et al. | 430/302 |
| 6,248,893 | B1 | * | 6/2001 | Williams et al. | 546/347 |

FOREIGN PATENT DOCUMENTS

| | | |
|---|---|---|
| EP | 0 652 483 A1 | 5/1995 |
| WO | WO 92/09934 | 6/1992 |

* cited by examiner

*Primary Examiner*—Janet Baxter
*Assistant Examiner*—Barbara Gilmore
(74) *Attorney, Agent, or Firm*—J. Lanny Tucker

(57) ABSTRACT

An imaging member, such as a negative-working printing plate or on-press cylinder, can be prepared with a hydrophilic imaging layer comprised of a heat-sensitive hydrophilic polymer having ionic moieties and an infrared radiation sensitive oxonol dye that has a $\lambda_{max}$ of greater than 700 nm. The heat-sensitive polymer and IR dye can be formulated in water or water-miscible solvents to provide highly thermal sensitive imaging compositions. In the imaging member, the polymer reacts to provide increased hydrophobicity in areas exposed to energy that provides or generates heat. For example, heat can be supplied by laser irradiation in the IR region of the electromagnetic spectrum. The heat-sensitive polymer is considered "switchable" in response to heat, and provides a lithographic image without wet processing.

28 Claims, No Drawings

THERMAL SWITCHABLE COMPOSITION AND IMAGING MEMBER CONTAINING OXONOL IR DYE AND METHODS OF IMAGING AND PRINTING

FIELD OF THE INVENTION

This invention relates in general to thermal imaging compositions, and to lithographic imaging members (particularly lithographic printing plates) prepared therefrom. The invention also relates to a method of imaging such imaging members, and to a method of printing using them.

BACKGROUND OF THE INVENTION

The art of lithographic printing is based upon the immiscibility of oil and water, wherein an oily material or ink is preferentially retained by an imaged area and the water or fountain solution is preferentially retained by the non-imaged areas. When a suitably prepared surface is moistened with water and ink is then applied, the background or non-imaged areas retain the water and repel the ink while the imaged areas accept the ink and repel the water. The ink is then transferred to the surface of a suitable substrate, such as cloth, paper or metal, thereby reproducing the image.

Very common lithographic printing plates include a metal or polymer support having thereon an imaging layer sensitive to visible or UV light. Both positive- and negative-working printing plates can be prepared in this fashion. Upon exposure, and perhaps post-exposure heating, either imaged or non-imaged areas are removed using wet processing chemistries.

Thermally sensitive printing plates are becoming more common. Examples of such plates are described in U.S. Pat. No. 5,372,915 (Haley et al). They include an imaging layer comprising a mixture of dissolvable polymers and an infrared radiation-absorbing compound. While these plates can be imaged using lasers and digital information, they require wet processing using alkaline developer solutions.

It has been recognized that a lithographic printing plate could be created by ablating an IR absorbing layer. For example, Canadian 1,050,805 (Eames) discloses a dry planographic printing plate comprising an ink receptive substrate, an overlying silicone rubber layer, and an interposed layer comprised of laser energy absorbing particles (such as carbon particles) in a self-oxidizing binder (such as nitrocellulose). Such plates were exposed to focused near IR radiation with a $Nd^{++}$YAG laser. The absorbing layer converted the infrared energy to heat thus partially loosening, vaporizing or ablating the absorber layer and the overlying silicone rubber. Similar plates are described in *Research Disclosure* 19201, 1980 as having vacuum-evaporated metal layers to absorb laser radiation in order to facilitate the removal of a silicone rubber overcoated layer. These plates were developed by wetting with hexane and rubbing. Other publications describing ablatable printing plates include U.S. Pat. No. 5,385,092 (Lewis et al), U.S. Pat. No. 5,339,737 (Lewis et al), U.S. Pat. No. 5,353,705 (Lewis et al), U.S. Pat. No. Reissue 35,512 (Nowak et al), and U.S. Pat. No. 5,378,580 (Leenders).

While the noted printing plates used for digital, processless printing have a number of advantages over the more conventional photosensitive printing plates, there are a number of disadvantages with their use. The process of ablation creates debris and vaporized materials that must be collected. The laser power required for ablation can be considerably high, and the components of such printing plates may be expensive, difficult to coat, or unacceptable for resulting printing quality. Such plates generally require at least two coated layers on a support.

Thermally switchable polymers have been described for use as imaging materials in printing plates. By "switchable" is meant that the polymer is rendered from hydrophobic to relatively more hydrophilic or, conversely from hydrophilic to relatively more hydrophobic, upon exposure to heat. U.S. Pat. No. 4,034,183 (Uhlig) describes the use of high powered lasers to convert hydrophilic surface layers to hydrophobic surfaces. A similar process is described for converting polyamic acids into polyimides in U.S. Pat. No. 4,081,572 (Pacansky). The use of high-powered lasers is undesirable in the industry because of their high electrical power requirements and because of their need for cooling and frequent maintenance.

U.S. Pat. No. 4,634,659 (Esumi et al) describes imagewise irradiating hydrophobic polymer coatings to render exposed regions more hydrophilic in nature. While this concept was one of the early applications of converting surface characteristics in printing plates, it has the disadvantages of requiring long UV light exposure times (up to 60 minutes), and the plate's use is in a positive-working mode only.

U.S. Pat. No. 4,405,705 (Etoh et al) and U.S. Pat. No. 4,548,893 (Lee et al) describe amine-containing polymers for photosensitive materials used in non-thermal processes. Thermal processes using polyamic acids and vinyl polymers with pendant quaternary ammonium groups are described in U.S. Pat. No. 4,693,958 (Schwartz et al). U.S. Pat. No. 5,512,418 (Ma) describes the use of polymers having cationic quaternary ammonium groups that are heat-sensitive. However, the materials described in this art require wet processing after imaging.

WO 92/09934 (Vogel et al) describes photosensitive compositions containing a photoacid generator and a polymer with acid labile tetrahydropyranyl or activated ester groups. However, imaging of these compositions converts the imaged areas from hydrophobic to hydrophilic in nature.

In addition, EP-A 0 652 483 (Ellis et al) describes lithographic printing plates imageable using IR lasers, and which do not require wet processing. These plates comprise an imaging layer that becomes more hydrophilic upon imagewise exposure to heat. This coating contains a polymer having pendant groups (such as t-alkyl carboxylates) that are capable of reacting under heat or acid to form more polar, hydrophilic groups. Imaging such compositions converts the imaged areas from hydrophobic to relatively more hydrophilic in nature, and thus requires imaging the background of the plate, which is generally a larger area. This can be a problem when imaging to the edge of the printing plate is desired.

Copending U.S. Ser. No. 09/162,905 (filed on Sep. 29, 1998) that was refiled as CIP U.S. Ser. No. 09/309,999 on May 11, 1999 and is now U.S. Pat. No. 6,190,830 B1, U.S. Ser. No. 09/163,020 (filed on Sep. 29, 1998) that was refiled as CIP U.S. Ser. No. 09/310,038 on May 11, 1999 and is now U.S. Pat. No. 6,190,831 B1, and U.S. Ser. No. 09/156,833 (filed on Sep. 18, 1998), now U.S. Pat. No. 5,985,514 are directed to processless direct write printing plates that include an imaging layer containing heat sensitive polymers. The polymer coatings are sensitized to infrared radiation by the incorporation of an infrared absorbing material such as an organic dye or a fine dispersion of carbon black. Upon exposure to a high intensity infrared laser, light absorbed by the organic dye or carbon black is converted to heat, thereby promoting a physical change in the polymer (usually a change in hydrophilicity or hydrophobicity). The resulting printing plates can be used on conventional printing presses to provide, for example, negative images. Such printing plates have utility in the evolving "computer-to-plate" printing market.

Some of the heat-sensitive polymers described in the copending applications, particularly the polymers containing organoonium or other charged groups, have a tendency to undergo physical interactions or chemical reactions with the organic dye or carbon black, thus compromising the effectiveness of both polymers and heat-absorbing materials.

Organic dye salts, by nature, are often partially soluble in water or alcoholic coating solvents and are thus preferred as IR dye sensitizers. However, many such salts have been found to be unacceptable because of insufficient solubility, because they react with the charged polymer to form hydrophobic products that can result in scummed or toned images, or because they offer insufficient thermal sensitization in imaging members. In particular, there is a need to have IR dye sensitizers that are compatible with thiosulfate polymers, such as those described in copending and commonly assigned U.S. Ser. No., 09/156,833 filed Sep. 18, 1998, now U.S. Pat. No. 5,985,514.

Thus, the graphic arts industry is seeking an alternative means for providing processless, direct-write lithographic imaging members that can be imaged without ablation, or the other problems noted above in relation to known processless direct write printing plates. It would also be desirable to have heat-sensitive imaging members that include IR dye sensitizers that are highly effective to convert light exposure into heat and that are compatible with various charged thermally sensitive polymers, including thiosulfate polymers.

SUMMARY OF THE INVENTION

The problems noted above are overcome with a heat-sensitive composition comprising:

a) a hydrophilic heat-sensitive ionomer, b) water or a water-miscible organic solvent, and c) an infrared radiation sensitive oxonol dye that is soluble in water or the water-miscible organic solvent and has a $\lambda_{max}$ greater than 700 nm as measured in water or the water-miscible organic solvent.

This invention also provides an imaging member comprising a support and having disposed thereon a hydrophilic imaging layer that is prepared from the heat-sensitive composition described above.

Still further, this invention includes a method of imaging comprising the steps of:

A) providing the imaging member described above, and

B) imagewise exposing the imaging member to provide exposed and unexposed areas in the imaging layer of the imaging member, whereby the exposed areas are rendered more hydrophobic than the unexposed areas by heat provided by the imagewise exposure.

Still again, a method of printing comprises the steps of carrying out steps A and B noted above, and additionally:

C) contacting the imagewise exposed imaging member with a lithographic printing ink, and imagewise transferring that printing ink from the imaging member to a receiving material.

As used herein, the term "ionomer" refers to a charged polymer having at least 20 mol % of the recurring units negatively or positively charged. These ionomers are generally referred to as "charged polymers" in the following disclosure.

The imaging members of this invention have a number of advantages, and provide solutions to the problems recognized in previous printing plates. Specifically, the problems and concerns associated with ablation imaging (that is, imagewise removal of a surface layer) are avoided because the hydrophilicity of the imaging layer is changed imagewise by "switching" (preferably, irreversibly) exposed areas of its printing surface to be less hydrophilic (that is, become more hydrophobic when heated). Thus, the imaging layer stays intact during and after imaging (that is, no ablation occurs). These advantages are achieved by using a hydrophilic heat-sensitive polymer having recurring ionic groups within the polymer backbone or chemically attached thereto. Such polymers and groups are described in more detail below. The polymers used in the imaging layer are readily prepared using procedures described herein, and the imaging members of this invention are simple to make and use without the need for post-imaging wet processing. The resulting printing members formed from the imaging members of this invention are generally negative-working in nature.

Charged polymers, such as organoonium or thiosulfate polymers that are used in the practice of this invention are typically coated out of water and methanol, solvents that readily dissolve these water-soluble polymeric salts.

The oxonol infrared radiation-sensitive dyes ("IR dyes" herein) used in this invention are desired IR sensitizers for thermal imaging members because they can be selected to have maximum absorption at the operating wavelength of a laser platesetter (generally 700 nm or more). Moreover, they can be coated in a dissolved (that is molecularly dispersed) state, providing for maximized utilization of energy as well as maximized image resolution capability. The heat-sensitive compositions of this invention provide increased photospeed at reduced IR dye coverage and produce minimum or no outgassing (reduced gaseous effluents). Furthermore, we have not observed adverse effects from an interaction of charged polymers (particularly thiosulfate polymers) and the oxonol IR dyes useful in the present invention.

DETAILED DESCRIPTION OF THE INVENTION

The imaging members of this invention comprise a support and one or more layers disposed thereon that include a dried heat-sensitive composition. The support can be any self-supporting material including polymeric films, glass, ceramics, cellulosic materials (including papers), metals or stiff papers, or a lamination of any of these materials. The thickness of the support can be varied. In most applications, the thickness should be sufficient to sustain the wear from printing and thin enough to wrap around a printing form. A preferred embodiment uses a polyester support prepared from, for example, polyethylene terephthalate or polyethylene naphthalate, and having a thickness of from about 100 to about 310 μm. Another preferred embodiment uses aluminum sheets having a thickness of from about 100 to about 600 μm. The support should resist dimensional change under conditions of use.

The support may also be a cylindrical support that includes printing cylinders on press as well as printing sleeves that are fitted over printing cylinders. The use of such supports to provide cylindrical imaging members is described in U.S. Pat. No. 5,713,287 (Gelbart). The heat-sensitive polymer composition can be coated or sprayed directly onto the cylindrical surface that is an integral part of the printing press.

The support may be coated with one or more "subbing" layers to improve adhesion of the final assemblage. Examples of subbing layer materials include, but are not limited to, gelatin and other naturally occurring and synthetic hydrophilic colloids and vinyl polymers (such as vinylidene chloride copolymers) that are known for such purposes in the photographic industry, vinylphosphonic acid polymers, sol gel materials such as those prepared from alkoxysilanes (including glycidoxypropyltriethoxysilane and aminopropyltriethoxysilane), epoxy functional polymers, and various ceramics.

The backside of the support may be coated with antistatic agents and/or slipping layers or matte layers to improve handling and "feel" of the imaging member.

The imaging members, however, preferably have only one layer on the support, that is a heat-sensitive surface layer that is required for imaging. This hydrophilic layer is prepared from a heat-sensitive composition of this invention and includes one or more heat-sensitive charged polymers and one or more oxonol IR dyes as a photothermal conversion material (both described below). Because of the particular polymer(s) used in the imaging layer, the exposed (imaged) areas of the layer are rendered more hydrophobic in nature. The unexposed areas remain hydrophilic in nature.

Thus, in the heat-sensitive imaging layer of the imaging member, only the one or more charged polymers and one or more oxonol IR dyes are essential for imaging. The charged polymers generally are comprised of recurring units, of which at least 20 mol % include ionic groups. Preferably, at least 30 mol % of the recurring groups include ionic groups. Thus each of these polymers has a net charge provided by these ionic groups. Preferably, the ionic groups are anionic groups.

The charged polymers (ionomers) useful in the practice of this invention can be in any of three broad classes of materials:

I) crosslinked or uncrosslinked vinyl polymers comprising recurring units comprising positively-charged, pendant N-alkylated aromatic heterocyclic groups, II) crosslinked or uncrosslinked polymers comprising recurring organoonium groups, and III) polymers comprising a pendant thiosulfate (Bunte salt) group.

Each class of polymers is described in turn. The imaging layer can include mixtures of polymers from each class, or a mixture of one or more polymers of two or more classes. The Class III polymers are preferred.

Class I Polymers:

The Class I polymers generally have a molecular weight of at least 1000 and can be any of a wide variety of hydrophilic vinyl homopolymers and copolymers having the requisite positively-charged groups. They are prepared from ethylenically unsaturated polymerizable monomers using any conventional polymerization technique. Preferably, the polymers are copolymers prepared from two or more ethylenically unsaturated polymerizable monomers, at least one of which contains the desired pendant positively-charged group, and another monomer that is capable of providing other properties, such as crosslinking sites and possibly adhesion to the support. Procedures and reactants needed to prepare these polymers are well known. With the additional teaching provided herein, the known polymer reactants and conditions can be modified by a skilled artisan to attach a suitable cationic group.

The presence of a cationic group apparently provides or facilitates the "switching" of the imaging layer from hydrophilic to hydrophobic in the areas that have been exposed to heat in some manner, when the cationic group reacts with its counterion. The net result is the loss of charge. Such reactions are more easily accomplished when the anion is more nucleophilic and/or more basic. For example, an acetate anion is typically more reactive than a chloride anion. By varying the chemical nature of the anion, the reactivity of the heat-sensitive polymer can be modified to provide optimal image resolution for a given set of conditions (for example, laser hardware and power, and printing press needs) balanced with sufficient ambient shelf life. Useful anions include the halides, carboxylates, sulfates, borates and sulfonates. Representative anions include, but are not limited to, chloride, bromide, fluoride, acetate, tetrafluoroborate, formate, sulfate, p-toluenesulfonate and others readily apparent to one skilled in the art. The halides and carboxylates are preferred.

The aromatic cationic group is present in sufficient recurring units of the polymer so that the heat-activated reaction described above can provide desired hydrophobicity of the imaged printing layer. The groups can be attached along a principal backbone of the polymer, or to one or more branches of a polymeric network, or both. The aromatic groups generally comprise 5 to 10 carbon, nitrogen, sulfur or oxygen atoms in the ring (at least one being a positively-charged nitrogen atom), to which is attached a branched or unbranched, substituted or unsubstituted alkyl group. Thus, the recurring units containing the aromatic heterocyclic group can be represented by the Structure I:

I

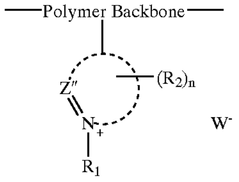

In this structure, $R_1$ is a branched or unbranched, substituted or unsubstituted alkyl group having from 1 to 12 carbon atoms (such as methyl, ethyl, n-propyl, isopropyl, t-butyl, hexyl, methoxymethyl, benzyl, neopentyl and dodecyl). Preferably, $R_1$ is a substituted or unsubstituted, branched or unbranched alkyl group having from 1 to 6 carbon atoms, and most preferably, it is substituted or unsubstituted methyl group.

$R_2$ can be a substituted or unsubstituted alkyl group (as defined above, and additionally a cyanoalkyl group, a hydroxyalkyl group or alkoxyalkyl group), substituted or unsubstituted alkoxy having 1 to 6 carbon atoms (such as methoxy, ethoxy, isopropoxy, oxymethylmethoxy, n-propoxy and butoxy), a substituted or unsubstituted aryl group having 6 to 14 carbon atoms in the ring (such as phenyl, naphthyl, anthryl, p-methoxyphenyl, xylyl, and alkoxycarbonylphenyl), halo (such as chloro and bromo), a substituted or unsubstituted cycloalkyl group having 5 to 8 carbon atoms in the ring (such as cyclopentyl, cyclohexyl and 4-methylcyclohexyl), or a substituted or unsubstituted heterocyclic group having 5 to 8 atoms in the ring including at least one nitrogen, sulfur or oxygen atom in the ring (such as pyridyl, pyridinyl, tetrahydrofuranyl and tetrahydropyranyl). Preferably, $R_2$ is substituted or unsubstituted methyl or ethyl group.

Z" represents the carbon and any additional nitrogen, oxygen, or sulfur atoms necessary to complete the 5- to 10-membered aromatic N-heterocyclic ring that is attached to the polymeric backbone. Thus, the ring can include two or more nitrogen atoms in the ring (for example, N-alkylated diazinium or imidazolium groups), or N-alkylated nitrogen-containing fused ring systems including, but not limited to, pyridinium, quinolinium, isoquinolinium acridinium, phenanthradinium and others readily apparent to one skilled in the art.

$W^-$ is a suitable anion as described above. Most preferably it is acetate or chloride.

Also in Structure I, n is defined as 0 to 6, and is preferably 0 or 1. Most preferably, n is 0.

The aromatic heterocyclic ring can be attached to the polymeric backbone at any position on the ring. Preferably, there are 5 or 6 atoms in the ring, one or two of which are nitrogen. Thus, the N-alkylated nitrogen containing aromatic group is preferably imidazolium or pyridinium and most preferably it is imidazolium.

The recurring units containing the cationic aromatic heterocycle can be provided by reacting a precursor polymer containing unalkylated nitrogen containing heterocyclic units with an appropriate alkylating agent (such as alkyl sulfonate esters, alkyl halides and other materials readily apparent to one skilled in the art) using known procedures and conditions.

Preferred Class I polymers can be represented by the following Structure II that represents random recurring units derived from one or more monomers as described below:

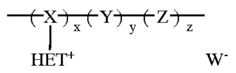

II wherein X represents recurring units to which the N-alkylated nitrogen containing aromatic heterocyclic groups (represented by $HET^+$) are attached, Y represents recurring units derived from ethylenically unsaturated polymerizable monomers that may provide active sites for crosslinking using any of various crosslinking mechanisms (described below), and Z represents recurring units derived from any additional ethylenically unsaturated polymerizable monomers. The various repeating units are present in suitable amounts, as represented by x being from about 20 to 100 mol %, y being from about 0 to about 20 mol %, and z being from 0 to 80 mol %. Preferably, x is from about 30 to about 98 mol %, y is from about 2 to about 10 mol % and z is from 0 to about 68 mol %.

Crosslinking of the polymers can be provided in a number of ways. There are numerous monomers and methods for crosslinking that are familiar to one skilled in the art. Some representative crosslinking strategies include, but are not necessarily limited to:

a) reacting an amine or carboxylic acid or other Lewis basic units with diepoxide crosslinkers, b) reacting an epoxide units within the polymer with difunctional amines, carboxylic acids, or other difunctional Lewis basic unit, c) irradiative or radical-initiated crosslinking of double bond-containing units such as acrylates, methacrylates, cinnamates, or vinyl groups, d) reacting a multivalent metal salts with ligating groups within the polymer (the reaction of zinc salts with carboxylic acid-containing polymers is an example), e) using crosslinkable monomers that react via the Knoevenagel condensation reaction, such as (2-acetoacetoxy)ethyl acrylate and methacrylate, f) reacting an amine, thiol, or carboxylic acid groups with a divinyl compound (such as bis (vinylsulfonyl) methane) via a Michael addition reaction, g) reacting a carboxylic acid units with crosslinkers having multiple aziridine units, h) reacting a crosslinkers having multiple isocyanate units with amines, thiols, or alcohols within the polymer, i) mechanisms involving the formation of interchain sol-gel linkages [such as the use of the 3-(trimethoxysilyl) propylmethacrylate monomer], j) oxidative crosslinking using an added radical initiator (such as a peroxide or hydroperoxide), k) autooxidative crosslinking, such as employed by alkyd resins, l) sulfur vulcanization, and m)processes involving ionizing radiation.

Monomers having crosslinkable groups or active crosslinkable sites (or groups that can serve as attachment points for crosslinking additives, such as epoxides) can be copolymerized with the other monomers noted above. Such monomers include, but are not limited to, 3-(trimethoxysilyl)propyl acrylate or methacrylate, cinnamoyl acrylate or methacrylate, N-methoxymethyl methacrylamide, N-aminopropylacrylamide hydrochloride, acrylic or methacrylic acid and hydroxyethyl methacrylate.

Additional monomers that provide the repeating units represented by "Z" in the Structure II above include any useful hydrophilic or oleophilic ethylenically unsaturated polymerizable monomer that may provide desired physical or printing properties to the hydrophilic imaging layer. Such monomers include, but are not limited to, acrylates, methacrylates, isoprene, acrylonitrile, styrene and styrene derivatives, acrylamides, methacrylamides, acrylic or methacrylic acid and vinyl halides.

Representative Class I polymers are identified hereinbelow as Polymers 1 and 3–6. Mixtures of these polymers can also be used. Polymer 2 below is a precursor to a useful Class I polymer.

Class II Polymers

The Class II polymers also generally have a molecular weight of at least 1000. They can be any of a wide variety of vinyl or non-vinyl homopolymers and copolymers.

Non-vinyl polymers of Class II include, but are not limited to, polyesters, polyamides, polyamide-esters, polyarylene oxides and derivatives thereof, polyurethanes, polyxylylenes and derivatives thereof, silicon-based sol gels (solsesquioxanes), polyamidoamines, polyimides, polysulfones, polysiloxanes, polyethers, poly(ether ketones), poly(phenylene sulfide)ionomers, polysulfides and polybenzimidazoles. Preferably, such non-vinyl polymers are silicon based sol gels, polyarylene oxides, poly (phenylene sulfide)ionomers or polyxylylenes, and most preferably, they are poly(phenylene sulfide)ionomers. Procedures and reactants needed to prepare all of these types of polymers are well known. With the additional teaching provided herein, the known polymer reactants and conditions can be modified by a skilled artisan to incorporate or attach a suitable cationic organoonium moiety.

Silicon-based sol gels useful in this invention can be prepared as a crosslinked polymeric matrix containing a silicon colloid derived from di-, tri- or tetraalkoxy silanes. These colloids are formed by methods described in U.S. Pat. No. 2,244,325, U.S. Pat. No. 2,574,902 and U.S. Pat. No. 2,597,872. Stable dispersions of such colloids can be conveniently purchased from companies such as the DuPont Company. A preferred sol-gel uses N-trimethoxysilylpropyl-N,N,N-trimethylammonium acetate both as the crosslinking agent and as the polymer layer forming material.

The presence of an organoonium moiety that is chemically incorporated into the polymer in some fashion apparently provides or facilitates the "switching" of the imaging layer from hydrophilic to oleophilic in the exposed areas upon exposure to energy that provides or generates heat, when the cationic moiety reacts with its counterion. The net result is the loss of charge. Such reactions are more easily accomplished when the anion of the organoonium moiety is more nucleophilic and/or more basic, as described above for the Class I polymers.

The organoonium moiety within the polymer can be chosen from a trisubstituted sulfur moiety (organosulfonium), a tetrasubstituted nitrogen moiety (organoammonium), or a tetrasubstituted phosphorous moiety (organophosphonium). The tetrasubstituted nitrogen (organoammonium) moieties are preferred. This moiety can be chemically attached to (that is, pendant) the polymer backbone, or incorporated within the backbone in some fashion, along with the suitable counterion. In either embodiment, the organoonium moiety is present in sufficient repeating units of the polymer (at least 20 mol %) so that the heat-activated reaction described above can occur to provide desired hydrophobicity of the imaging layer. When chemically attached as a pendant group, the organoonium moiety can be attached along a principal backbone of the polymer, or to one or more branches of a polymeric network, or both. When chemically incorporated within the polymer backbone, the moiety can be present in either cyclic or acyclic form, and can also form a branching point in a polymer network. Preferably, the organoonium moiety is provided as a pendant group along the polymeric backbone. Pendant organoonium moieties can be chemically attached to the polymer backbone after polymer formation, or functional groups on the polymer can be converted to organoonium moieties using known chemistry. For example, pendant quaternary ammonium groups can be provided on a polymeric backbone by the displacement of a "leaving group" functionality (such as a halogen) by a tertiary amine nucleophile. Alternatively, the organoonium group can be present on a monomer that is then polymerized or derived by the alkylation of a neutral heteroatom unit (trivalent nitrogen or phosphorous group or divalent sulfur group) already incorporated within the polymer.

The organoonium moiety is substituted to provide a positive charge. Each substituent must have at least one carbon atom that is directly attached to the sulfur, nitrogen or phosphorus atom of the organoonium moiety. Useful substituents include, but are not limited to, substituted or unsubstituted alkyl groups having 1 to 12 carbon atoms and preferably from 1 to 7 carbon atoms (such as methyl, ethyl, n-propyl, isopropyl, t-butyl, hexyl, methoxyethyl, isopropoxymethyl, substituted or unsubstituted aryl groups (phenyl, naphthyl, p-methylphenyl, m-methoxyphenyl, p-chlorophenyl, p-methylthiophenyl, p-N,N-dimethylaminophenyl, xylyl, methoxycarbonylphenyl and cyanophenyl), and substituted or unsubstituted cycloalkyl groups having 5 to 8 carbon atoms in the carbocyclic ring (such as cyclopentyl, cyclohexyl, 4-methylcyclohexyl and 3-methylcyclohexyl). Other useful substituents would be readily apparent to one skilled in the art, and any combination of the expressly described substituents is also contemplated.

The organoonium moieties include any suitable anion as described above for the Class I polymers. The halides and carboxylates are preferred.

Representative Class II non-vinyl polymers are identified herein below as Polymers 7–8 and 10. Mixtures of these polymers can also be used. Polymer 9 is a precursor to Polymer 10.

In addition, vinyl Class II polymers can be used in the practice of this invention. Like the non-vinyl polymers, such heat-sensitive polymers are composed of recurring units having one or more types of organoonium group. For example, such a polymer can have recurring units with both organoammonium groups and organosulfonium groups. It is also not necessary that all of the organoonium groups have the same alkyl substituents. For example, a polymer can have recurring units having more than one type of organoammonium group. Useful anions in these polymers are the same as those described above for the non-vinyl polymers. In addition, the halides and carboxylates are preferred.

The organoonium group is present in sufficient recurring units of the polymer so that the heat-activated reaction described above can occur to provide desired hydrophobicity of the imaged printing layer. The group can be attached along a principal backbone of the polymer, or to one or more branches of a polymeric network, or both. Pendant groups can be chemically attached to the polymer backbone after polymer formation using known chemistry. For example, pendant organoammonium, organophosphonium or organosulfonium groups can be provided on a polymeric backbone by the nucleophilic displacement of a pendant leaving group (such as a halide or sulfonate ester) on the polymeric chain by a trivalent amine, divalent sulfur or trivalent phosphorous nucleophile. Pendant onium groups can also be provided by alkylation of corresponding pendant neutral heteroatom groups (nitrogen, sulfur or phosphorous) using any commonly used alkylating agent such as alkyl sulfonate esters or alkyl halides. Alternatively a monomer precursor containing the desired organoammonium, organophosphonium or organosulfonium group may be polymerized to yield the desired polymer.

The organoammonium, organophosphonium or organosulfonium group in the vinyl polymer provides the desired positive charge. Generally, preferred pendant organoonium groups can be illustrated by the following Structures III, IV and V:

III

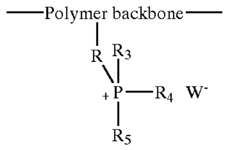

IV

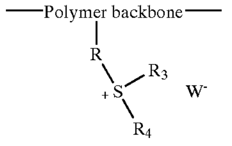

V

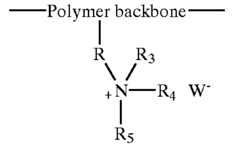

wherein R is a substituted or unsubstituted alkylene group having 1 to 12 carbon atoms that can also include one or more oxy, thio, carbonyl, amido or alkoxycarbonyl groups with the chain (such as methylene, ethylene, isopropylene, methylenephenylene, methyleneoxymethylene, n-butylene and hexylene), a substituted or unsubstituted arylene group having 6 to 10 carbon atoms in the ring (such as phenylene, naphthylene, xylylene and 3-methoxyphenylene), or a substituted or unsubstituted cycloalkylene group having 5 to 10 carbon atoms in the ring (such as 1,4-cyclohexylene, and 3-methyl-1,4-cyclohexylene). In addition, R can be a combination of two or more of the defined substituted or unsubstituted alkylene, arylene and cycloalkylene groups. Preferably, R is a substituted or unsubstituted ethyleneoxycarbonyl or phenylenemethylene group. Other useful substituents not listed herein could include combinations of any of those groups listed above as would be readily apparent to one skilled in the art.

$R_3$, $R_4$ and $R_5$ are independently substituted or unsubstituted alkyl group having 1 to 12 carbon atoms (such as methyl, ethyl, n-propyl, isopropyl, t-butyl, hexyl, hydroxymethyl, methoxymethyl, benzyl, methylenecarboalkoxy and a cyanoalkyl), a substituted or unsubstituted aryl group having 6 to 10 carbon atoms in the carbocyclic ring (such as phenyl, naphthyl, xylyl, p-methoxyphenyl, p-methylphenyl, m-methoxyphenyl, p-chlorophenyl, p-methylthiophenyl, p-N,N-dimethylaminophenyl, methoxycarbonylphenyl and cyanophenyl), or a substituted or unsubstituted cycloalkyl group having 5 to 10 carbon atoms in the carbocyclic ring (such as 1,3- or 1,4-cyclohexyl). Alternatively, any two of $R_3$, $R_4$ and $R_5$ can be combined to form a substituted or unsubstituted heterocyclic ring with the charged phosphorus, sulfur or nitrogen atom, the ring having 4 to 8 carbon, nitrogen, phosphorus, sulfur or oxygen atoms in the ring. Such heterocyclic rings include, but are not limited to, substituted or unsubstituted morpholinium, piperidinium and pyrrolidinium groups for Structure V. Other useful substituents for these various groups would be readily apparent to one skilled in the art, and any combinations of the expressly described substituents are also contemplated.

Preferably, $R_3$, $R_4$ and $R_5$ are independently substituted or unsubstituted methyl or ethyl groups.

$W^-$ is any suitable anion as described above for the Class I polymers. Acetate and chloride are preferred anions.

Polymers containing quaternary ammonium groups as described herein are most preferred vinyl Class II polymers.

The vinyl Class II polymers useful in the practice of this invention can be represented by the following Structure VI that represents random recurring units derived from one or more monomers as described below:

VI

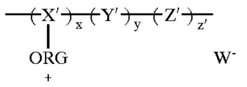

wherein X' represents recurring units to which the organoonium groups ("ORG") are attached, Y' represents recurring units derived from ethylenically unsaturated polymerizable monomers that may provide active sites for crosslinking using any of various crosslinking mechanisms (described below), and Z' represents recurring units derived from any additional ethylenically unsaturated polymerizable monomers. The various recurring units are present in suitable amounts, as represented by x' being from about 20 to about 99 mol %, y' being from about 1 to about 20 mol %, and z' being from 0 to about 79 mol %. Preferably, x' is from about 30 to about 98 mol %, y' is from about 2 to about 10 mol % and z' is from 0 to about 68 mol %.

Crosslinking of the vinyl polymer can be achieved in the same way as described above for the Class I polymers.

Additional monomers that provide the additional recurring units represented by Z' in Structure VI include any useful hydrophilic or oleophilic ethylenically unsaturated polymerizable monomer that may provide desired physical or printing properties to the imaging layer. Such monomers include, but are not limited to, acrylates, methacrylates, acrylonitrile, isoprene, styrene and styrene derivatives, acrylamides, methacrylamides, acrylic or methacrylic acid and vinyl halides.

Representative vinyl polymers of Class II include Polymers 11–18 as identified herein below. A mixture of any two or more of these polymers can also be used.

Class III Polymers

Each of the Class III polymers has a molecular weight of at least 1000, and preferably of at least 5000. For example, the polymers can be vinyl homopolymers or copolymers prepared from one or more ethylenically unsaturated polymerizable monomers that are reacted together using known polymerization techniques and reactants. Alternatively, they can be addition homopolymers or copolymers (such as polyethers) prepared from one or more heterocyclic monomers that are reacted together using known polymerization techniques and reactants. Additionally, they can be condensation type polymers (such as polyesters, polyimides, polyamides or polyurethanes) prepared using known polymerization techniques and reactants. Whatever the type of polymers, at least 20 mol % (preferably 30 mol %) of the total recurring units in the polymer comprise the necessary heat-activatable thiosulfate groups.

The Class III polymers useful in the practice of this invention can be represented by the Structure VII wherein the thiosulfate group (or Bunte salt) is a pendant group:

VII

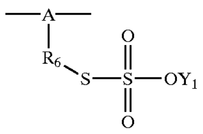

wherein A represents a polymeric backbone, $R_6$ is a divalent linking group, and Y is hydrogen or a cation.

Useful polymeric backbones include, but are not limited to, vinyl polymers, polyethers, polyimides, polyamides, polyurethanes and polyesters. Preferably, the polymeric backbone is a vinyl polymer or polyether.

Useful $R_6$ linking groups include $—(COO)_n(Z_1)_m—$ wherein n is 0 or 1, m is 0 or 1, and $Z_1$ is a substituted or unsubstituted alkylene group having 1 to 6 carbon atoms (such as methylene, ethylene, n-propylene, isopropylene, butylenes, 2-hydroxypropylene and 2-hydroxy-4-azahexylene) that can have one or more oxygen, nitrogen or sulfur atoms in the chain, a substituted or unsubstituted arylene group having 6 to 14 carbon atoms in the aromatic ring (such as phenylene, naphthalene, anthracylene and xylylene), or a substituted or unsubstituted arylenealkylene (or alkylenearylene) group having 7 to 20 carbon atoms in the chain (such as p-methylenephenylene, phenylenemethylenephenylene, biphenylene and phenyleneisopropylenephenylene). In addition, $R_6$ can be an alkylene group, an arylene group, in an arylenealkylene group as defined above for $Z_1$.

Preferably, $R_6$ is a substituted or unsubstituted of alkylene group of 1 to 3 carbon atoms, a substituted or unsubstituted arylene group of 6 carbon atoms in the aromatic ring, an arylenealkylene group of 7 or 8 carbon atoms in the chain, or $—COO(Z_1)_m—$ wherein $Z_1$ is methylene, ethylene or phenylene. Most preferably, $R_6$ is phenylene, methylene or —COO—.

$Y_1$ is hydrogen, ammonium ion, or a metal ion (such as sodium, potassium, magnesium, calcium, cesium, barium, zinc or lithium ion). Preferably, $Y_1$ is hydrogen, sodium ion or potassium ion.

As the thiosulfate group is generally pendant to the backbone, preferably it is part of an ethylenically unsaturated polymerizable monomer that can be polymerized using conventional techniques to form vinyl homopolymers of the thiosulfate-containing recurring units, or vinyl copolymers when copolymerized with one or more additional ethylenically unsaturated polymerizable monomers. The thiosulfate-containing recurring units generally comprise at least 20 mol % of all recurring units in the polymer, preferably they comprise from about 30 to 100 mol % of all recurring units. A polymer can include more than one type of repeating unit containing a thiosulfate group as described herein.

Polymers having the above-described thiosulfate group are believed to crosslink and to switch from hydrophilic thiosulfate to hydrophobic disulfide (upon loss of sulfate) with heating.

Thiosulfate-containing molecules (or Bunte salts) can be prepared from the reaction between an alkyl halide and thiosulfate salt as taught by Bunte, *Chem.Ber*. 7, 646, 1884. Polymers containing thiosulfate groups can either be prepared from functional monomers or from preformed polymers. Polymers can also be prepared from preformed polymers in a similar manner as described in U.S. Pat. No. 3,706,706 (Vandenberg). Thiosulfate-containing molecules can also be prepared by reaction of an alkyl epoxide with a thiosulfate salt, or between an alkyl epoxide and a molecule containing a thiosulfate moiety (such as 2-aminoethanethiosulfuric acid), and the reaction can be performed either on a monomer or polymer as illustrated by Thames, *Surf. Coating*, 3 (Waterborne Coat.), Chapter 3, pp. 125–153, Wilson et al (Eds.).

Representative synthetic methods for making ethylenically unsaturated polymerizable monomers and Class III polymers (Polymers 19–29) are illustrated below. Vinyl polymers can be prepared by copolymerizing monomers containing the thiosulfate functional groups with one or more other ethylenically unsaturated polymerizable monomers to modify polymer chemical or functional properties, to optimize imaging member performance, or to introduce additional crosslinking capability.

Useful additional ethylenically unsaturated polymerizable monomers include, but are not limited to, acrylates (including methacrylates) such as ethyl acrylate, n-butyl acrylate, methyl methacrylate and t-butyl methacrylate, acrylamides (including methacrylamides), an acrylonitrile (including methacrylonitrile), vinyl ethers, styrenes, vinyl acetate, dienes (such as ethylene, propylene, 1,3-butadiene and isobutylene), vinyl pyridine and vinylpyrrolidone. Acrylamides, acrylates and styrenes are preferred.

The imaging layer of the imaging member can include one or more Class I, II or III polymers with or without minor amounts (less than 20 weight %, based on total dry weight of the layer) of additional binder or polymeric materials that will not adversely affect its imaging properties.

In the composition used to provide the heat-sensitive layer, the amount of charged polymer is generally present in an amount of at least 1 weight %, and preferably at least 2 weight %. A practical upper limit of the amount of charged polymer in the composition is about 10 weight %.

The amount of charged polymer(s) used in the imaging layer is generally at least 0.1 $g/m^2$, and preferably from about 0.1 to about 10 $g/m^2$ (dry weight). This generally provides an average dry thickness of from about 0.1 to about 10 $\mu$m.

The imaging layer can also include one or more conventional surfactants for coatability or other properties, dyes or colorants to allow visualization of the written image, or any other addenda commonly used in the lithographic art, as long as the concentrations are low enough so they are inert with respect to imaging or printing properties.

It is essential that the heat-sensitive imaging layer includes one or more photothermal conversion materials to absorb appropriate radiation from an appropriate energy source (such as a laser), which radiation is converted into heat. Thus, such materials convert photons into heat. Preferably, the radiation absorbed is in the infrared and near-infrared regions of the electromagnetic spectrum. The photothermal conversion materials useful in this invention are oxonol IR dyes that comprise a methine linkage conjugated to a negatively charged group.

It is also essential that the oxonol IR dye be soluble in water or any of the water-miscible organic solvents that are described below as useful for preparing heat-sensitive compositions. Preferably, the IR dyes are soluble in either water or methanol, or a mixture of water and methanol. Solubility in water or the water-miscible organic solvents means that the oxonol IR dye can be dissolved at a concentration of at least 0.5 g/l at room temperature at room temperature.

The oxonol IR dyes are sensitive to radiation in the near-infrared and infrared regions of the electromagnetic spectrum. Thus, they generally have a $\lambda_{max}$ at or above 700 nm (preferably a $\lambda_{max}$ of from about 750 to about 900 nm, and more preferably a $\lambda_{max}$ of from about 800 to about 850 nm).

The oxonol IR dyes useful in this invention are generally anionic dyes having a polymethine chain conjugated with 2 cyclic or aliphatic groups, one of which is negatively charged. The structures of such dyes can vary as would be will understood by one skilled in the dye art. Such a person would be able to synthesize a useful oxonol IR dye that is soluble in a suitable solvent and that has the appropriate $\lambda_{max}$ that can be provided by a suitable combination of the length of the methine linkage, the groups to which it is attached and solvent. For example, generally the useful oxonol IR dyes have a methine linkage comprising at least 3 carbon—carbon double bonds in the conjugated chain. Preferably, the methine linkage has at least 4 carbon—carbon double bonds in the conjugated chain, and more preferably the methine chain has at least 5 carbon—carbon double bonds.

Useful oxonol IR dyes can be synthesized using general procedures described by Hamer in *The Cyanine Dyes and Related Compounds*, Interscience Publishers, 1964. A preferred synthetic method is described below. The dyes may be provided for incorporation into the heat-sensitive formulations of this invention in any suitable manner. In a preferred embodiment, the dyes are dissolved in a suitable organic solvent. Other synthetic methods are described in U.S. Pat. No. 5,399,690 (Diehl et al) incorporated herein by reference for its teaching of various oxonol IR dyes and synthetic methods.

Particularly useful oxonol IR dyes useful in the practice of this invention include, but are not limited to, the compounds represented by Structure DYE I or DYE II shown as follows:

DYE I:

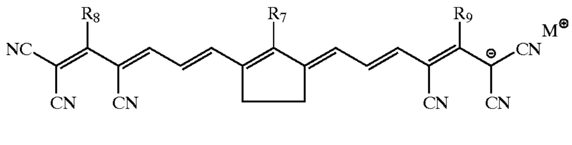

-continued

DYE II:

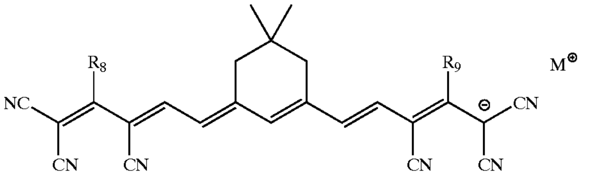

wherein $R_7$ is a secondary or tertiary amine. The nitrogen atom of this amine group can be substituted, for example, with one or more substituted or unsubstituted alkyl groups having 1 to 20 carbon atoms (methyl, ethyl, isopropyl, t-butyl, hexyl, dodecyl, aminoethyl, methyl sulfonaminoethyl and other groups readily apparent to one skilled in the art), substituted or unsubstituted aryl groups (such as phenyl, naphthyl, xylyl, m-carboxyphenyl and others than would be readily apparent to one skilled in the art), substituted or unsubstituted heterocyclic groups having 3 to 9 carbon, oxygen, nitrogen and sulfur atoms in the ring structure (such as morpholino, pyridyl, pyrimidyl, thiomorpholino, pyrrolidinyl, piperazinyl and others that would be readily apparent to one skilled in the art). In addition, $R_7$ can be

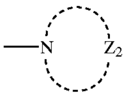

wherein $Z_2$ represents the carbon, nitrogen, oxygen and sulfur atoms necessary to complete a substituted or unsubstituted 5- to 9-membered heterocyclic ring (such as morpholino, thiomorpholino, piperidinyl and piperazinyl).

Preferably, $R_7$ is a secondary amine having at least one phenyl substituent, or $R_7$ is

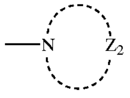

wherein $Z_2$ represents the carbon, nitrogen and oxygen atoms necessary to complete a substituted or unsubstituted 5- or 6-membered heterocyclic group. Most preferably, $Z_2$ represents the carbon, nitrogen and oxygen atoms necessary to complete a substituted or unsubstituted morpholino, thiomorpholinyl or piperazinyl group.

$R_8$ and $R_9$ are independently substituted or unsubstituted heterocyclic or carbocyclic aromatic groups having from 5 to 12 atoms in the aromatic ring. Preferably, $R_8$ and $R_9$ represent the same aromatic group. Useful aromatic groups include, but are not limited to, substituted or unsubstituted phenyl groups, substituted or unsubstituted naphthyl groups, substituted or unsubstituted furyl groups, substituted and unsubstituted thiophenyl groups, and substituted or unsubstituted benzofuryl groups. These aromatic groups can be substituted with one or more amino, methoxy, carboxy, sulfo, sulfonamido or alkylsulfonyl groups. Preferably, when $R_8$ and $R_9$ are substituted, they each have one or more of the same substituents.

$M^+$ is a suitable monovalent cation such as an alkali metal ion (lithium, sodium or potassium), an ammonium ion, a trialkylammonium ion (such as trimethylammonium, triethyleammonium or tributylammonium ions), a tetraalkylammonium ion (such as tetramethylammonium ion), pyridinium ion or tetramethyl guanidinium ion.

Examples of such useful aromatic IR dyes include, but are not limited to, the following compounds:

DYE 1

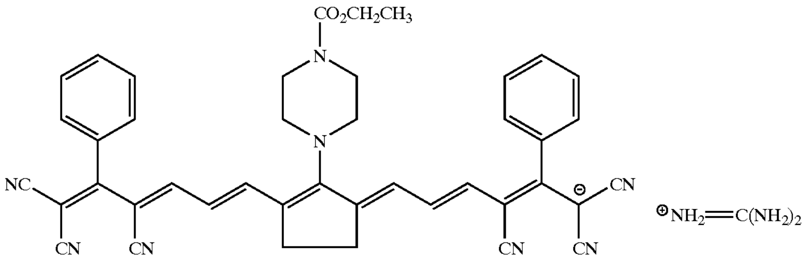

DYE 2

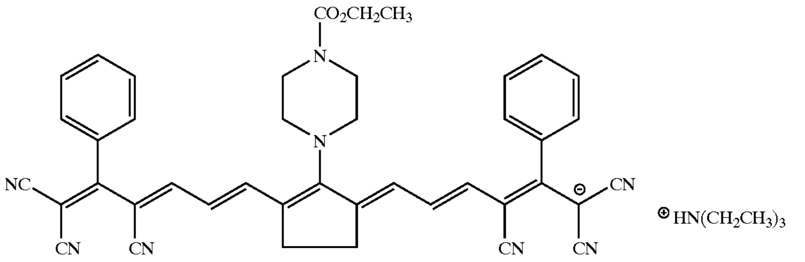

DYE 3

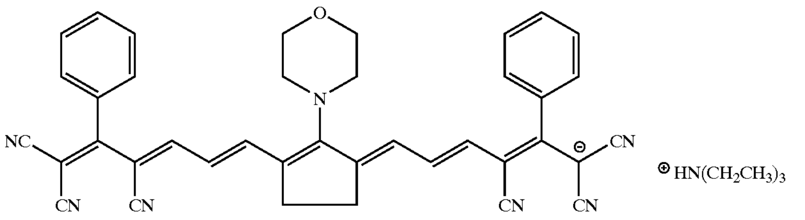

-continued
DYE 4
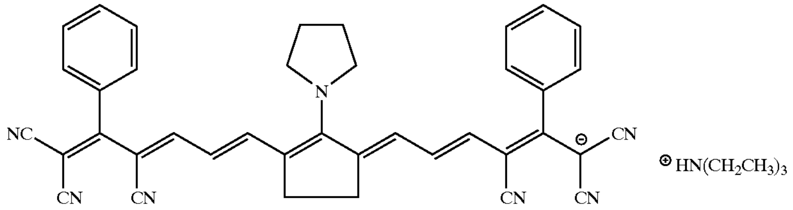
DYE 5
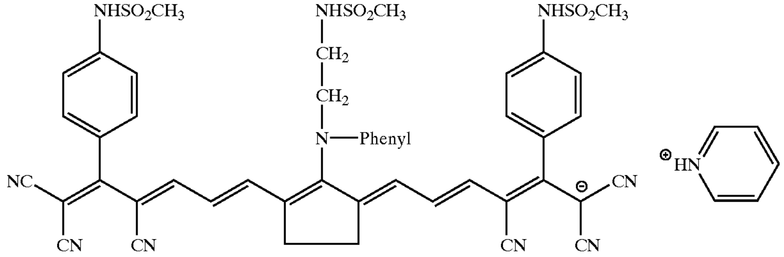
DYE 6
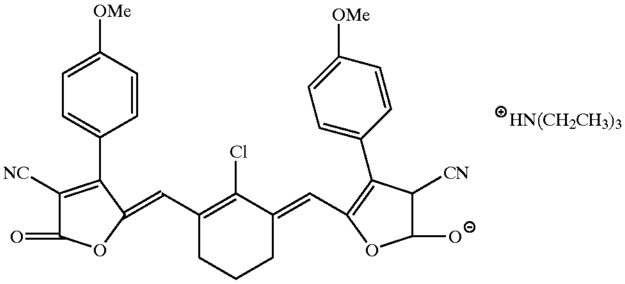
DYE 7
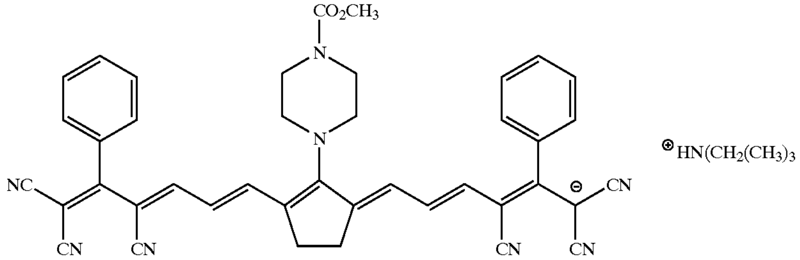
DYE 8
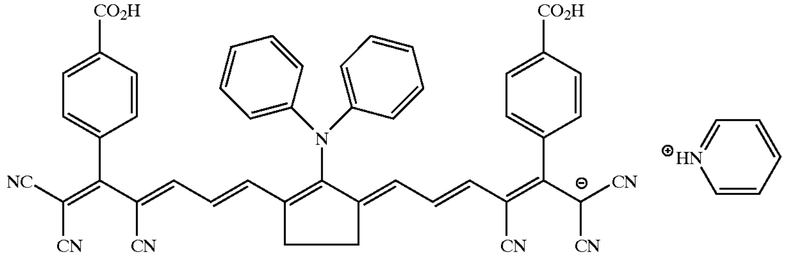
DYE 9
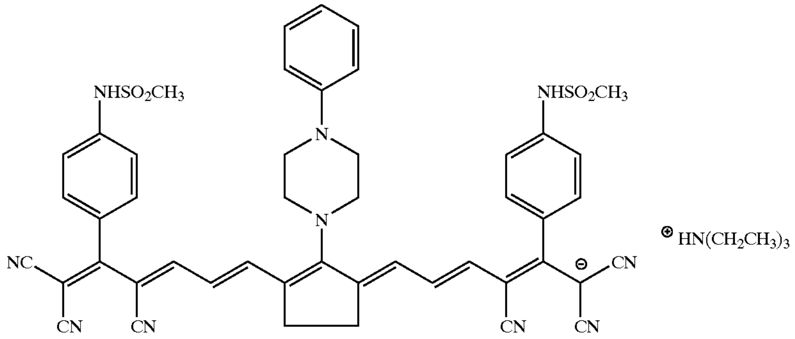

-continued
DYE 10
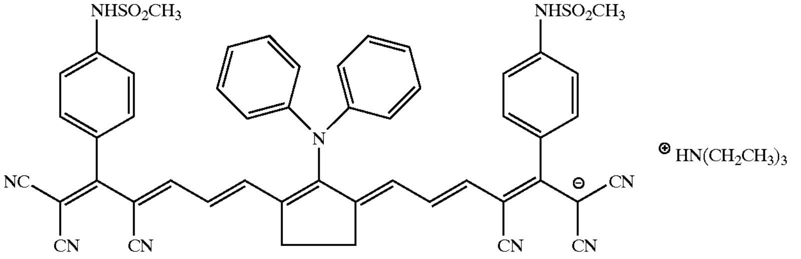
DYE 11
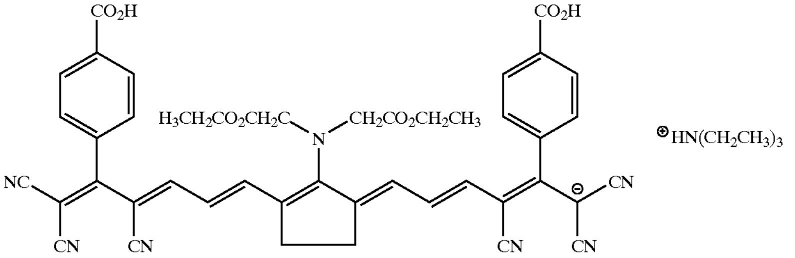
DYE 12
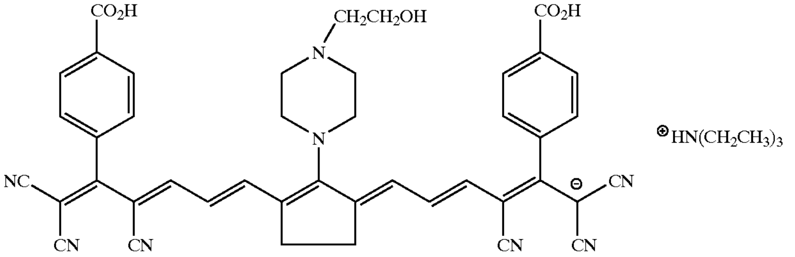
DYE 13
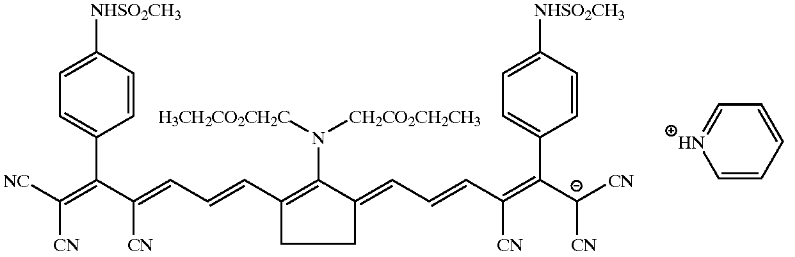
DYE 14
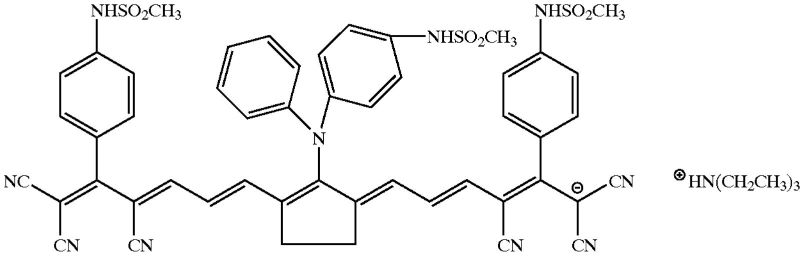
DYE 15
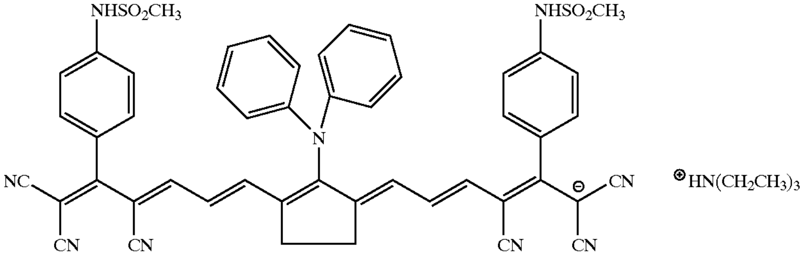

-continued
DYE 16
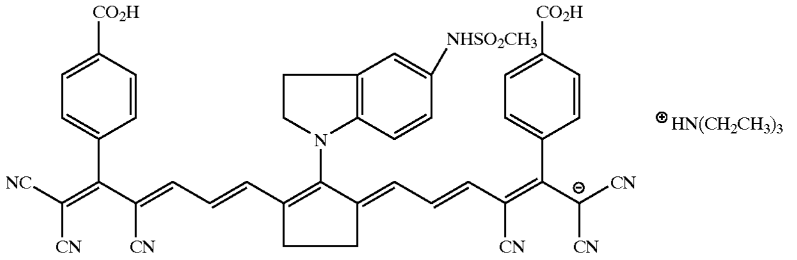
DYE 17
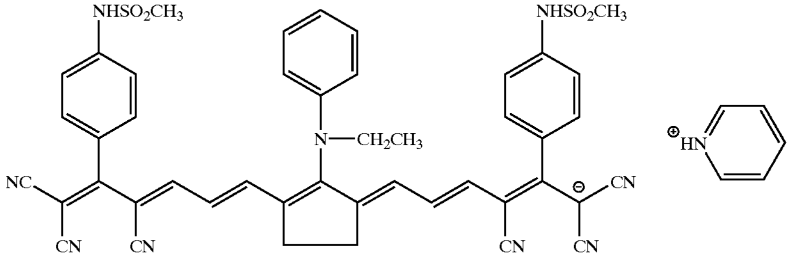
DYE 18
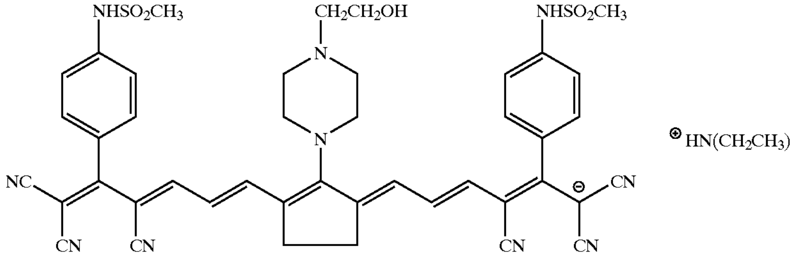
DYE 19
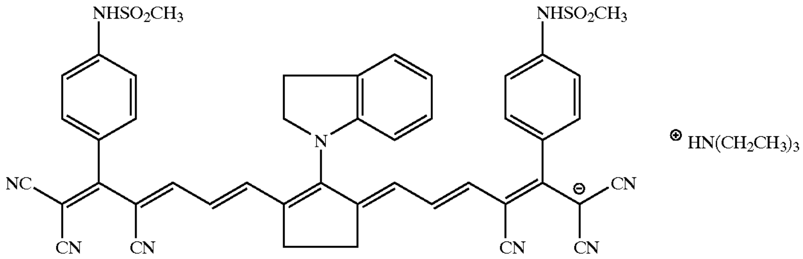
DYE 20
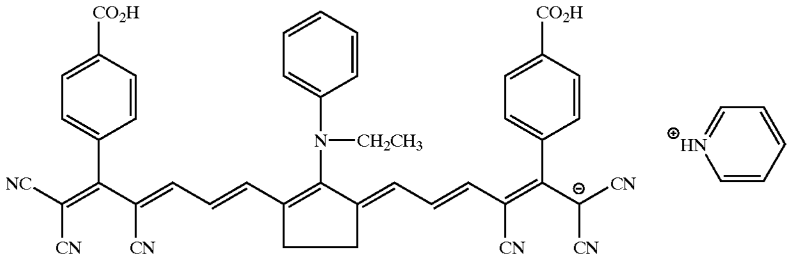
DYE 21
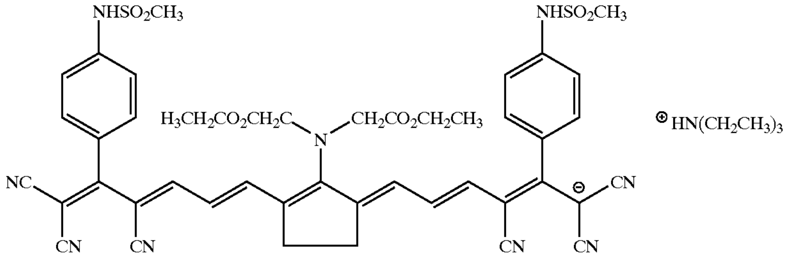

-continued
DYE 22
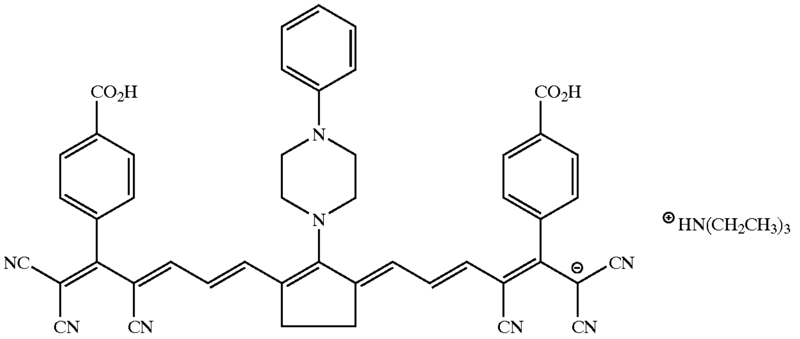
DYE 23
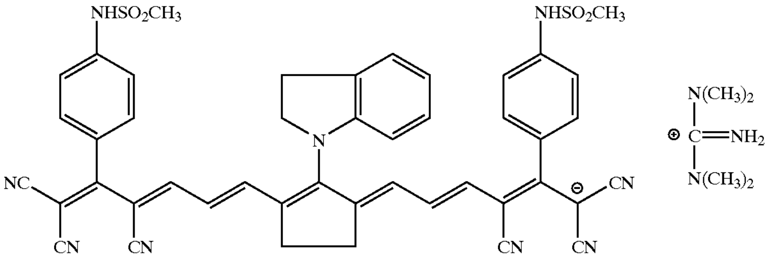
DYE 24
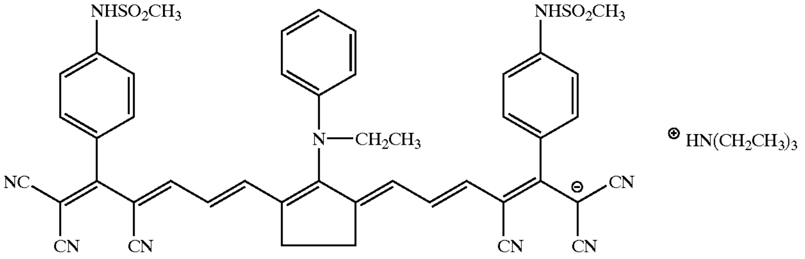
DYE 25
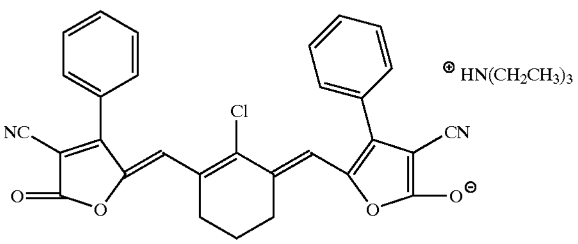
DYE 26
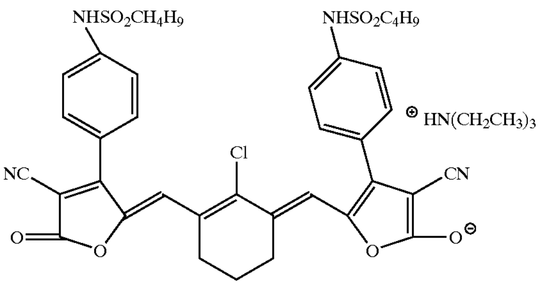

-continued

DYE 27

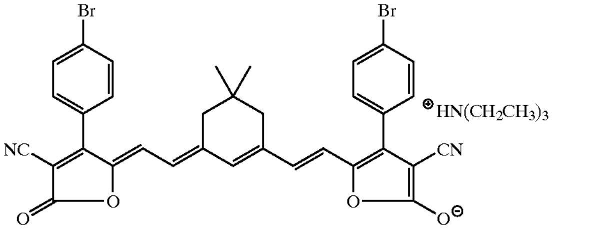

DYE 28

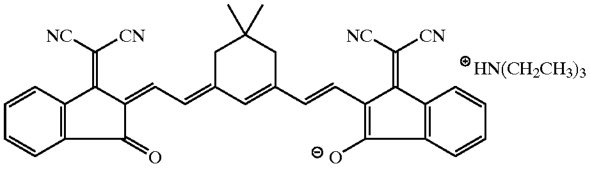

In reference to Structure DYE I wherein $R_8$ and $R_9$ are each a phenyl group, other useful IR dyes include:

| IR Dye | $R_7$ | $M^{\oplus}$ |
|---|---|---|
| DYE 29 | 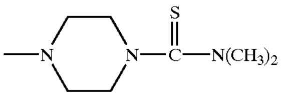 | $\overset{\oplus}{H}N(CH_2CH_3)_3$ |
| DYE 30 | 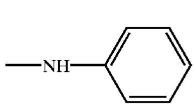 | $\overset{\oplus}{H}N(CH_2CH_3)_3$ |
| DYE 31 | 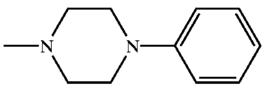 | $\overset{\oplus}{H}N(CH_2CH_3)_3$ |
| DYE 32 | 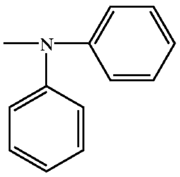 | $\overset{\oplus}{H}N(CH_2CH_3)_3$ |
| DYE 33 | 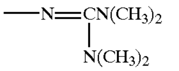 | $\overset{\oplus}{H}N(CH_2CH_3)_3$ |
| DYE 34 | 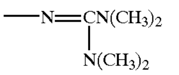 | 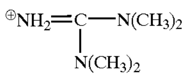 |
| DYE 35 |  | $\overset{\oplus}{H}N(CH_2CH_3)_3$ |

In reference to Structure DYE II wherein $R_8$ and $R_9$ are the same, still another useful IR Dye is:

| IR Dye | $R_8$ | $M^{\oplus}$ |
|---|---|---|
| DYE 36 | 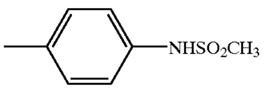 | $\overset{\oplus}{H}N(CH_2CH_3)_3$ |

The one or more oxonol IR dyes are present in the heat-sensitive or thermal imaging composition of this invention in an amount of generally at least 0.2 weight %, and preferably at least 0.4 weight %. The upper limit of oxonol IR dye is not critical but is governed by the IR dye cost, desired thermal sensitivity and solvent solubility. A practical limit may be about 1 weight %. The amount of IR dye is provided in the heat-imaging layer of an imaging member sufficient to provide a transmission optical density of at least 0.1, and preferably of at least 0.3 when exposed to radiation having a $\lambda_{max}$ of 830 nm.

The heat-sensitive compositions and imaging layers can include additional photothermal conversion materials, although the presence of such materials is not preferred. Such optional materials can be other IR dyes, carbon black, polymer-grafted carbon, pigments, evaporated pigments, semiconductor materials, alloys, metals, metal oxides, metal sulfides or combinations thereof, or a dichroic stack of materials that absorb radiation by virtue of their refractive index and thickness. Borides, carbides, nitrides, carbonitrides, bronze-structured oxides and oxides structurally related to the bronze family but lacking the $WO_{2.9}$ component, are also useful. Useful absorbing dyes for near infrared diode laser beams are described, for example, in U.S. Pat. No. 4,973,572 (DeBoer). Particular dyes of interest are "broad band" dyes, that is those that absorb over a wide band of the spectrum.

Alternatively, the same or different photothermal conversion material (including an oxonol IR dye described herein) can be provided in a separate layer that is in thermal contact with the heat-sensitive imaging layer. Thus, during imaging, the action of the additional photothermal conversion material can be transferred to the heat-sensitive imaging layer.

The heat-sensitive composition of this invention can be applied to a support using any suitable equipment and procedure, such as spin coating, knife coating, gravure coating, dip coating or extrusion hopper coating. In addition, the composition can be sprayed onto a support, including a cylindrical support, using any suitable spraying means for example as described in U.S. Pat. No. 5,713,287 (noted above).

The heat-sensitive compositions of this invention are generally formulated in and coated from water or water-miscible organic solvents including, but not limited to, water-miscible alcohols (for example, methanol, ethanol, isopropanol, 1-methoxy-2-propanol and n-propanol), methyl ethyl ketone, tetrahydrofuran, acetonitrile, N-N-dimethylformamide, butyrolactone and acetone. Water, methanol, ethanol and 1-methoxy-2-propanol are preferred. Mixtures (such as a mixture of water and methanol) of these solvents can also be used if desired. By "water-miscible" is meant that the solvent is soluble in water at all proportions at room temperature.

The imaging members of this invention can be of any useful form including, but not limited to, printing plates, printing cylinders, printing sleeves and printing tapes (including flexible printing webs), all of any suitable size or dimensions. Preferably, the imaging members are printing plates or on-press cylinders.

During use, the imaging member of this invention is exposed to a suitable source of energy that generates or provides heat, such as a focused laser beam or a thermoresistive head, in the foreground areas where ink is desired in the printed image, typically from digital information supplied to the imaging device. A laser used to expose the imaging member of this invention is preferably a diode laser, because of the reliability and low maintenance of diode laser systems, but other lasers such as gas or solid state lasers may also be used. The combination of power, intensity and exposure time for laser imaging would be readily apparent to one skilled in the art. Specifications for lasers that emit in the near-IR region, and suitable imaging configurations and devices are described in U.S. Pat. No. 5,339,737 (Lewis et al), incorporated herein by reference with respect to such imaging devices. The imaging member is typically sensitized so as to maximize responsiveness at the emitting wavelength of the laser.

The imaging apparatus can operate on its own, functioning solely as a platemaker, or it can be incorporated directly into a lithographic printing press. In the latter case, printing may commence immediately after imaging, thereby reducing press set-up time considerably. The imaging apparatus can be configured as a flatbed recorder or as a drum recorder, with the imaging member mounted to the interior or exterior cylindrical surface of the drum.

In the drum configuration, the requisite relative motion between an imaging device (such as laser beam) and the imaging member can be achieved by rotating the drum (and the imaging member mounted thereon) about its axis, and moving the imaging device parallel to the rotation axis, thereby scanning the imaging member circumferentially so the image "grows" in the axial direction. Alternatively, the beam can be moved parallel to the drum axis and, after each pass across the imaging member, incremented angularly so that the image "grows" circumferentially. In both cases, after a complete scan by the laser beam, an image corresponding to the original document or picture can be applied to the surface of the imaging member.

In the flatbed configuration, a laser beam is drawn across either axis of the imaging member, and is indexed along the other axis after each pass. Obviously, the requisite relative motion can be produced by moving the imaging member rather than the laser beam.

While laser imaging is preferred in the practice of this invention, imaging can be provided by any other means that provides or generates thermal energy in an imagewise fashion. For example, imaging can be accomplished using a thermoresistive head (thermal printing head) in what is known as "thermal printing", described for example in U.S. Pat. No. 5,488,025 (Martin et al). Such thermal printing heads are commercially available (for example, as Fujisu Thermal Head FTP-040 MCS001 and TDK Thermal Head F415 HH7-1089).

Imaging of heat-sensitive compositions on printing press cylinders can be accomplished using any suitable means, for example, as taught in U.S. Pat. No. 5,713,287 (noted above), that is incorporated herein by reference.

After imaging, the imaging member can be used for printing without conventional wet processing. Applied ink can be imagewise transferred to a suitable receiving material (such as cloth, paper, metal, glass or plastic) to provide one or more desired impressions. If desired, an intermediate blanket roller can be used to transfer the ink from the imaging member to the receiving material. The imaging members can be cleaned between impressions, if desired, using conventional cleaning means.

The following examples illustrate the practice of the invention, and are not meant to limit it in any way. The synthetic methods are presented to show how some of the preferred heat-sensitive polymers and aromatic IR dyes can be prepared.

Polymers 1, 3–6 are illustrative of Class I polymers (Polymer 2 is a precursor to Polymer 3), Polymers 7–8 and 10 are illustrative of Class II non-vinyl polymers (Polymer 9 is a precursor to Polymer 10), Polymers 11–18 are illustrative of Class II vinyl polymers, and Polymers 19–28 are illustrative of Class III polymers.

Synthetic Methods

Preparation of Polymer 1: Poly(1-vinyl-3-methylimidazolium Chloride-co-N-(3-aminopropyl) Methacrylamide Hydrochloride)

A] Preparation of 1-Vinyl-3-methylimidazolium Methanesulfonate Monomer:

Freshly distilled 1-vinylimidazole (20.00 g, 0.21 mol) was combined with methyl methanesulfonate (18.9 ml, 0.22 mol) and 3-t-butyl-4-hydroxy-5-methylphenyl sulfide (about 1 mg) in diethyl ether (100 ml) in a round bottomed flask equipped with a reflux condenser and a nitrogen inlet and stirred at room temperature for 48 hours. The resulting precipitate was filtered off, thoroughly washed with diethyl ether, and dried overnight under vacuum at room temperature to afford 37.2 g of product as a white, crystalline powder (86.7% yield).

B] Copolymerization/ion Exchange:

1-Vinyl-3-methylimidazolium methanesulfonate (5.00 g, $2.45\times10^{-2}$ mol), N-(3-aminopropyl)methacrylamide hydrochloride (0.23 g, $1.29\times10^{-3}$ mol) and 2,2'-azobisisobutyronitrile (AIBN) (0.052 g, $3.17\times10^{-4}$ mol) were dissolved in methanol (60 ml) in a 250 ml round bottomed flask equipped with a rubber septum. The solution was bubble degassed with nitrogen for ten minutes and heated at 60° C. in a water bath for 14 hours. The viscous solution was precipitated into 3.5 liters of tetrahydrofuran and dried under vacuum overnight at 50° C. to give 4.13 g of product (79.0% yield). The polymer was then dissolved in 100 ml methanol and converted to the chloride by passage through a flash column containing 400 $cm^3$ DOWEX® 1X8-100 ion exchange resin.

Preparation of Polymer 2: Poly(methyl Methacrylate-co-4-vinylpyridine)(9:1 Molar Ratio)

Methyl methacrylate (30 ml), 4-vinylpyridine (4 ml), AIBN (0.32 g, $1.95\times10^{-3}$ mol), and N,N-dimethylformamide (40 ml, DMF) were combined in a 250 ml round bottomed flask and fitted with a rubber septum. The solution was purged with nitrogen for 30 minutes and heated for 15 hours at 60° C. Methylene chloride and DMF (150 ml of each) were added to dissolve the viscous product and the product solution was precipitated twice into isopropyl ether. The precipitated polymer was filtered and dried overnight under vacuum at 60° C.

Preparation of Polymer 3: Poly(methyl Methacrylate-co-N-methyl-4-vinylpyridinium Formate) (9:1 Molar Ratio)

Polymer 2 (10 g) was dissolved in methylene chloride (50 ml) and reacted with methyl p-toluenesulfonate (1 ml) at reflux for 15 hours. NMR analysis of the reaction showed that only partial N-alkylation had occurred. The partially reacted product was precipitated into hexane, then dissolved in neat methyl methanesulfonate (25 ml) and heated at 70°

C. for 20 hours. The product was precipitated once into diethyl ether and once into isopropyl ether from methanol and dried under vacuum overnight 60° C. A flash chromatography column was loaded with 300 $cm^3$ of DOWEX® 550 hydroxide ion exchange resin in water eluent. This resin was converted to the formate by running a liter of 10% formic acid through the column. The column and resin were thoroughly washed with methanol, and the product polymer (2.5 g) was dissolved in methanol and passed through the column. Complete conversion to the formate counterion was confirmed by ion chromatography.

Preparation of Polymer 4: Poly(methyl Methacrylate-co-N-butyl-4-vinylpyridinium Formate) (9:1 Molar Ratio)

Polymer 2 (5 g) was heated at 60° C. for 15 hours in 1-bromobutane (200 ml). The precipitate that formed was dissolved in methanol, precipitated into diethyl ether, and dried for 15 hours under vacuum at 60° C. The polymer was converted from the bromide to the formate using the method described in the preparation of Polymer 3.

Preparation of Polymer 5: Poly(methyl Methacrylate-co-2-vinylpyridine) (9:1 Molar Ratio)

Methyl methacrylate (18 ml), 2-vinylpyridine (2 ml), AIBN (0.16 g,), and DMF (30 ml) were combined in a 250 ml round bottomed flask and fitted with a rubber septum. The solution was purged with nitrogen for 30 minutes and heated for 15 hours at 60° C. Methylene chloride (50 ml) was added to dissolve the viscous product and the product solution was precipitated twice into isopropyl ether. The precipitated polymer was filtered and dried overnight under vacuum at 60° C.

Preparation of Polymer 6: Poly(methyl Methacrylate-co-N-methyl-2-vinylpyridinium Formate) (9:1 Molar Ratio)

Polymer 5 (10 g) was dissolved in 1,2-dichloroethane (100 ml) and reacted with methyl p-toluenesulfonate (15 ml) at 70° C. for 15 hours. The product was precipitated twice into diethyl ether and dried under vacuum overnight at 60° C. A sample (2.5 g) of this polymer was converted from the p-toluenesulfonate to the formate using the procedure described above for Polymer 3.

Preparation of Polymer 7: Poly(p-xylidenetetrahydro-thiophenium Chloride)

Xylylene-bis-tetrahydrothiophenium chloride (5.42 g, 0.015 mol) was dissolved in 75 ml of deionized water and filtered through a fritted glass funnel to remove a small amount of insolubles. The solution was placed in a three-neck round-bottomed flask on an ice bath and was sparged with nitrogen for fifteen minutes. A solution of sodium hydroxide (0.68 g, 0.017 mol) was added dropwise over fifteen minutes via addition funnel. When about 95% of the hydroxide solution was added, the reaction solution became very viscous and the addition was stopped. The reaction was brought to pH 4 with 10% HCl and purified by dialysis for 48 hours.

Preparation of Polymer 8: Poly[phenylene Sulfide-co-methyl(4-thiophenyl)Sulfonium Chloride]

Poly (phenylene sulfide) (15.0 g, 0.14 mol-repeating units), methanesulfonic acid (75 ml), and methyl triflate (50.0 g, 0.3 mol) were combined in a 500 ml round bottomed flask equipped with a heating mantle, reflux condenser, and nitrogen inlet. The reaction mixture was heated to 90° C. at which point a homogeneous, brown solution resulted, and was allowed to stir at room temperature overnight. The reaction mixture was poured into 500 $cm^3$ of ice and brought to neutrality with sodium bicarbonate. The resultant liquid/solid mixture was diluted to a final volume of 2 liters with water and dialyzed for 48 hours at which point most of the solids had dissolved. The remaining solids were removed by filtration and the remaining liquids were slowly concentrated to a final volume of 700 ml under a stream of nitrogen. The polymer was ion exchanged from the triflate to the chloride by passing it through a column of DOWEX® 1×8–100 resin. Analysis by $^1H$ NMR showed that methylation of about 45% of the sulfur groups had occurred.

Preparation of Polymer 9: Brominated Poly(2,6-dimethyl-1 4-phenylene Oxide)

Poly (2,6-dimethyl-1,4-phenylene oxide) (40 g, 0.33 mol repeating units) was placed dissolved in carbon tetrachloride (2400 ml) in a 5 liter round bottomed 3-neck flask with a reflux condenser and a mechanical stirrer. The solution was heated to reflux and a 150 Watt flood lamp was applied. N-bromosuccinimide (88.10 g, 0.50 g) was added portion-wise over 3.5 hours, and the reaction was allowed to stir at reflux for an additional hour. The reaction was cooled to room temperature to yield an orange solution over a brown solid. The liquid was decanted and the solids were stirred with 100 ml methylene chloride to leave a white powder (succinimide) behind. The liquid phases were combined, concentrated to 500 ml via rotary evaporation, and precipitated into methanol to yield a yellow powder. The crude product was precipitated twice more into methanol and dried overnight under vacuum at 60° C. Elemental and $^1H$ NMR analyses showed a net 70% bromination of benzyl side chains.

Preparation of Polymer 10: Dimethyl Sulfonium Bromide Derivative of Poly(2,6-dimethyl-1,4-phenylene Oxide)

Brominated poly(2,6-dimethyl-1,4-phenylene oxide) described above (2.00 g, 0.012 mol benzyl bromide units) was dissolved in methylene chloride (20 ml) in a 3-neck round bottomed flask outfitted with a condenser, nitrogen inlet, and septum. Water (10 ml) was added along with dimethyl sulfide (injected via syringe) and the two-phase mixture was stirred at room temperature for one hour and then at reflux at which point the reaction turned into a thick dispersion. This was poured into 500 ml of tetrahydrofuran and agitated vigorously in a chemical blender. The product, which gelled after approximately an hour in the solid state, was recovered by filtration and quickly redissolved in 100 ml methanol and stored as a methanolic solution.

Preparation of Polymer 11: Poly[methyl Methacrylate-co-2-trimethylammoniumethyl Methacrylic Chloride-co-N-(3-aminopropyl) Methacrylamide Hydrochloride] (7:2:1 Molar Ratio)

Methyl methacrylate (24.6 ml, 0.23 mol), 2-trimethylammoniumethyl methacrylic chloride (17.0 g, 0.08 mol), n-(3-aminopropyl)methacrylamide hydrochloride (10.0 g, 0.56 mol), azobisisobutyronitrile (0.15 g, $9.10\times10^{-4}$ mol, AIBN), water (20 ml) and dimethylformamide (150 ml) were combined in a round bottom flask fitted with a rubber septum. The solution was bubble degassed with nitrogen for 15 minutes and placed in a heated water bath at 60° C. overnight. The viscous product solution was diluted with methanol (125 ml) and precipitated three times from methanol into isopropyl ether. The product was dried under vacuum at 60° C. for 24 hours and stored in a dessicator.

Preparation of Polymer 12: Poly[methyl Methacrylate-co-2-trimethylammoniumethyl Methacrylic Acetate-co-N-(3-aminopropyl) Methacrylamide] (7:2:1 Molar Ratio)

Polymer 11 (3.0 g) was dissolved in 100 ml of methanol and neutralized by passing through a column containing 300 $cm^3$ of tertiary amine functionalized crosslinked polystyrene resin (Scientific Polymer Products #726, 300 $cm^2$) with methanol eluent. That polymer was then converted to the acetate using a column of 300 $cm^3$ DOWEX® 1×8–100 ion exchange resin (that is, converted from the chloride to the acetate by washing with 500 ml glacial acetic acid) and methanol eluent.

Preparation of Polymer 13: Poly[methyl Methacrylate-co-2-trimethylammoniumethyl Methacrylic Fluoride-co-N-(3-aminopropyl) Methacrylamide Hydrochloride] (7:2:1 Molar Ratio)

Polymer 11 (3.0 g) was dissolved in 100 ml of methanol and neutralized by passing through a column containing 300 $cm^3$ tertiary amine functionalized crosslinked polystyrene resin (Scientific Polymer Products #726, 300 $cm^2$) with methanol eluent. The polymer was then converted to the fluoride using a column of 300 $cm^3$ DOWEX® 1×8–100 ion exchange resin (that is, converted from the chloride to the fluoride by washing with 500 g of potassium fluoride) and methanol eluent.

Preparation of Polymer 14: Poly[vinylbenzyl Trimethylammonium Chloride-co-N-(3-aminopropyl)Methacrylamide Hydrochloride] (19:1 Molar Ratio)

Vinylbenzyl trimethylammonium chloride (19 g, 0.0897 mol, 60:40 mixture of p, m isomers), N-(3-aminopropyl) methacrylamide hydrochloride (1 g, 0.00562 mol), 2,2'-azobis(2-methylpropionamidine) dihydrochloride (0.1 g), and deionized water (80 ml) were combined in a round bottom flask fitted with a rubber septum. The reaction mixture was bubble degassed with nitrogen for 15 minutes and placed in a water bath at 60° C. for four hours. The resulting viscous product solution was precipitated into acetone, dried under vacuum at 60° C. for 24 hours, and stored in a dessicator.

Preparation of Polymer 15: Poly([vinylbenzyltrimethyl-phosphonium Acetate-co-N-(3-aminopropyl)Methacrylamide Hydrochloride] (19:1 Molar Ratio)

A] Vinylbenzyl Bromide (60:40 mixture of p,m isomers):

Vinylbenzyl chloride (50.60 g, 0.33 mol, 60:40 mixture of p,m isomers), sodium bromide (6.86 g, $6.67\times10^{-2}$ mol), N-methylpyrrolidone (300 ml, passed through a short column of basic alumina), ethyl bromide (260 g), and 3-t-butyl-4-hydroxy-5-methyl phenyl sulfide (1.00 g, $2.79\times10^{-3}$ mol) were combined in a 1 liter round bottomed flask fitted with a reflux condenser and a nitrogen inlet and the mixture was heated at reflux for 72 hours at which point the reaction was found to have proceeded to >95% conversion by gas chromatography. The reaction mixture was poured into 1 liter of water and extracted twice with 300 ml of diethyl ether. The combined ether layers were extracted twice with 1 liter of water, dried over $MgSO_4$, and the solvents were stripped by rotary evaporation to yield yellowish oil. The crude product was purified by vacuum distillation to afford 47.5 g of product (53.1% yield).

B] Vinylbenzyl Trimethylphosphonium Bromide:

Trimethylphosphine (50.0 ml of a 1.0 molar solution in tetrahydrofuran, $5.00\times10^{-2}$ mol) was added via addition funnel over about 2 minutes into a thoroughly nitrogen degassed dispersion of vinylbenzyl bromide (9.85 g, $5.00\times10^{-2}$ mol) in diethyl ether (100 ml). A solid precipitate began to form almost immediately. The reaction was allowed to stir for 4 hours at room temperature, then was placed in a freezer overnight. The solid product was isolated by filtration, washed three times with 100 ml of diethyl ether, and dried under vacuum for 2 hours. Pure product (11.22 g) was recovered as a white powder (82.20% yield).

C] Poly[vinylbenzyltrimethylphosphonium Bromide-co-N-(3-aminopropyl)methacrylamide] (19:1 Molar Ratio):

Vinylbenzyltrimethylphosphonium bromide (5.00 g, $1.83\times10^{-2}$ mol), N-(3-aminopropyl)methacrylamide hydrochloride (0.17 g, $9.57\times10^{-4}$ mol), azobisisobutyronitrile (0.01 g, $6.09\times10^{-5}$ mol), water (5.0 ml), and dimethylformamide (25 ml) were combined in a 100 ml round bottomed flask sealed with a rubber septum, bubble degassed for 10 minutes with nitrogen, and placed in a warm water bath (55° C.) overnight. The viscous solution was precipitated into tetrahydrofuran and dried under vacuum overnight at 60° C. The liquids were filtered off, concentrated on a rotary evaporator to a volume of about 200 ml, precipitated again into tetrahydrofuran, and dried under vacuum overnight at 60° C. About 4.20 g was recovered. (81.9% yield).

D] Poly[vinylbenzyltrimethylphosphonium Acetate-co-N-(3-aminopropyl)methacrylamide Hydrochloride] (19:1 Molar Ratio):

DOWEX® 550 a hydroxide anion exchange resin (about 300 $cm^3$) was poured into a flash column with 3:1 methanol/water eluent. About 1 liter of glacial acetic acid was passed through the column to convert it to the acetate, followed by about 3 liters of 3:1 methanol/water. 3.0 g of the product from step C in 200 ml of 3:1 methanol/water was passed through the acetate resin column and the solvents were stripped on a rotary evaporator. The resulting viscous oil was thoroughly dried under vacuum to afford 2.02 g of a glassy, yellowish material (Polymer 15, 67.9% yield). Ion chromatography showed complete conversion to the acetate.

Preparation of Polymer 16: Poly[dimethyl-2-(methacryloyloxy)Ethylsulfonium Chloride-co-N-(3-aminopropyl)Methacrylamide Hydrochloride] (19:1 Molar Ratio)

A] Dimethyl-2-(methacryloyloxy)ethylsulfonium Methylsulfate: 2-(Methylthio)ethylmethacrylate (30.00 g, 0.19 mol), dimethyl sulfate (22.70 g, 0.18 mol), and benzene (150 ml) were combined in a 250 ml round bottomed flask outfitted with a reflux condenser and a nitrogen inlet. The reaction solution was heated at reflux for 1.5 hours and allowed to stir at room temperature for 20 hours at which point the reaction had proceeded to about 95% yield by $^1H$ NMR. The solvent was removed by rotary evaporation to afford brownish oil that was stored as a 20 weight % solution in dimethylformamide and used without further purification.

B] Poly[dimethyl-2-(methacryloyloxy)ethylsulfonium Methylsulfate-co-N-(3-aminopropyl)methacrylamide Hydrochloride] (19:1 Molar Ratio):

Dimethyl-2-(methacryloyloxy)ethylsulfonium methylsulfate (93.00 g of 20 wt. % solution in dimethylformamide, $6.40\times10^{-2}$ mol), N-(3-aminopropyl) methacrylamide hydrochloride (0.60 g, $3.36\times10^{-3}$ mol), and azobisisobutyronitrile (0.08 g, $4.87\times10^{-4}$ mol) were dissolved in methanol (100 ml) in a 250 ml round bottomed flask fitted with a septum. The solution was bubble degassed with nitrogen for 10 minutes and heated for 20 hours in a warm water bath at 55° C. The reaction was precipitated into ethyl acetate, redissolved in methanol, precipitated a second time into ethyl acetate, and dried under vacuum overnight. A white powder (15.0 g) was recovered (78.12% yield).

C] Poly[dimethyl-2-(methacryloyloxy)ethylsulfonium Chloride-co-N-(3-aminopropyl)methacrylamide Hydrochloride] (19:1 Molar Ratio):

The precursor polymer (2.13 g) from step B was dissolved in 100 ml of 4:1 methanol/water and passed through a flash column containing 300 $cm^3$ of DOWEX® 1×8–100 anion exchange resin using 4:1 methanol/water eluent. The recovered solvents were concentrated to about 30 ml and precipitated into 300 ml of methyl ethyl ketone. The damp, white powder collected was redissolved in 15 ml of water and stored in a refrigerator as a solution of Polymer 16 (10.60% solids).

Preparation of Polymer 17: Poly [vinylbenzyldimethylsulfonium Methylsulfate]

A] Methyl(vinylbenzyl)Sulfide:

Sodium methanethiolate (24.67 g, 0.35 mol) was combined with methanol (250 ml) in a 1 liter round bottomed flask outfitted with an addition funnel and a nitrogen inlet. Vinylbenzyl chloride (41.0 ml, 60:40 mixture of p- and o-isomers, 0.29 mol) in tetrahydrofuran (100 ml) was added via addition funnel over 30 minutes. The reaction mixture grew slightly warm and a milky suspension resulted. This was allowed to stir at room temperature for 20 hours at which point only a small amount of vinylbenzyl chloride was still evident by thin layer chromatography (2:1 hexanes/ $CH_2Cl_2$ eluent). Another portion of sodium methanethiolate was added (5.25 g, $7.49\times10^{-2}$ mol) and after ten minutes, the reaction had proceeded to completion by thin layer chromatography. Diethyl ether (400 ml) was added and the resulting mixture was extracted twice with 600 ml of water and once with 600 ml of brine. The resulting organic extracts were dried over magnesium sulfate, a small amount (about 1 mg) of 3-t-butyl-4-hydroxy-5-methyl phenyl sulfide was added, and the solvents were stripped by rotary evaporation to afford a yellowish oil. Purification by vacuum distillation through a long Vigreux column yielded 43.35 g (91%) of the pure product as a clear liquid.

B] Dimethyl(vinylbenzyl)sulfonium Methylsulfate:

Methyl(vinylbenzyl)sulfide (13.59 g, $8.25\times10^{-2}$ mol), benzene (45 ml), and dimethyl sulfate (8.9 ml, $9.4\times10^{-2}$ mol) were combined in a 100 ml round bottomed flask equipped with a nitrogen inlet. The mixture was allowed to stir at room temperature for 44 hours, at which point two layers were present. Water (20 ml) was added and the top (benzene) layer was removed by pipette. The aqueous layer was extracted three times with 30 ml of diethyl ether and a vigorous stream of nitrogen was bubbled through the solution to remove residual volatile compounds. The product was used without further purification as a 35% (w/w) solution.

C] Poly[dimethyl(vinylbenzyl)sulfonium Methylsulfate]:

All of the dimethyl(vinylbenzyl)sulfonium methylsulfate solution from the previous step (approximately $5.7\times10^{-2}$ mol) was combined with water (44 ml) and sodium persulfate (0.16 g, $6.72\times10^{-4}$ mol) in a 200 ml round bottomed flask fitted with a rubber septum. The reaction solution was bubble degassed with nitrogen for ten minutes and heated for 24 hours in a water bath at 50° C. As the solution did not appear viscous, additional sodium persulfate (0.16 g, $6.72\times10^{-4}$ mol) was added and the reaction was allowed to proceed for 18 more hours at 50° C. The solution was then precipitated into acetone and immediately redissolved in water to give 100 ml of a solution of Polymer 17 (11.9% solids).

Preparation of Polymer 18: Poly [vinylbenzyldimethylsulfonium Chloride]

The aqueous product solution of Polymer 17 (16 ml, ~4.0 g solids) was precipitated into a solution of benzyltrimethylammonium chloride (56.0 g) in isopropanol (600 ml). The solvents were decanted and the solids were washed by stirring for 10 minutes in 600 ml of isopropanol and quickly dissolved in water to give 35 ml of a solution of Polymer 18 (11.1% solids). Analysis by ion chromatography showed >90% conversion to the chloride.

Synthesis of Poly(chloromethyl-ethylene Oxide-co-sodium Thiosulfate Methyl-ethylene oxide) from Polymer: Polymers 19–21

Poly(epichlorohydrin) (Aldrich Chemical Company, $M_n$=700,000) (10 g) was dissolved in 250 ml of anhydrous dimethylsulfoxide (DMSO) and anhydrous sodium thiosulfate (17.0 g) was added. The mixture was heated at 65° C. for 24 hours. After cooling to room temperature, the hazy reaction mixture was dialyzed against water. A small amount of the resulting polymer (Polymer 19) solution was freeze dried for elemental analysis and the rest of the polymer solution was subject to imaging testing. Elemental analysis indicated the reaction conversion to sodium thiosulfate was 16 mol %.

In another reaction of the same scale, the reaction mixture was heated at 85° C. for 40 hours. Elemental analysis of the resulting polymer (Polymer 20) indicated the conversion to sodium thiosulfate was 26 mol %. When the reaction was carried out at 65° C. for 18 hours, the conversion to sodium thiosulfate was 13 mol % (Polymer 21).

Synthesis of Polymers 22 and 23

Synthesis of Poly(vinyl Benzyl Thiosulfate Sodium Salt-co-methyl Methacylate) from Polymer: Polymer 22

Vinyl benzyl chloride (10 g, 0.066 mol), methyl methacrylate (15.35 g, 0.153 mol) and AIBN (0.72g, 4 mmol) were dissolved 120 ml of toluene. The solution was purged with dry nitrogen and then heated at 65° C. overnight. After cooling to room temperature, the solution was dropwise added to 1200 ml of isopropanol. The resulting white powdery polymer was collected by filtration and dried under vacuum at 60° C. overnight. $^1H$ NMR analysis indicate that the copolymer contained 44 mol % of vinyl benzyl chloride.

This polymer (16 g) was dissolved in 110 m of N,N'-dimethylformamide. To this solution was added sodium thiosulfate (12 g) and water (20 ml). Some polymer precipitated out. The cloudy reaction mixture was heated at 90° C. for 24 hours. After cooling to room temperature, the hazy reaction mixture was dialyzed against water. A small amount of the resulting polymer solution was freeze dried for elemental analysis and the rest of the polymer solution was subject to imaging testing. Elemental analysis indicated that all the vinyl benzyl chloride was converted to sodium thiosulfate salt.

Poly(vinyl benzyl thiosulfate sodium salt-co-styrene) (Polymer 23) was similarly prepared.

Synthesis of Poly[vinyl Benzyl Thiosulfate Sodium Salt-co-N-(3-aminopropyl)methacrylamide Hydrochloride] from Monomer: Polymer 24

Vinyl benzyl chloride (20 g, 0.131 mol) was dissolved in 50 ml of ethanol in a 250 ml round-bottomed flask and placed in a 30° C. water bath. Sodium thiosulfate (18.8 g, 0.119 mol) was dissolved in 60 ml of 2:1 ethanol:water mixture, added to an addition funnel, and dripped into vinyl benzyl chloride solution over a period of 60 minutes. The reaction was stirred warm for additional 2 hours. Solvent was then evaporated and the white solid was dissolved in hot ethanol and hot filtered. White crystalline product was formed in the filtrate.

The resulting monomer (2 g, 8 mmol), 3-aminopropyl methacrylamide hydrochloride (0.16 g, 0.8 mmol), and 4,4'-azobis(4-cyanovaleric acid) (75% in water, 30 mg) were added to a 25 ml round-bottomed flask. The solution was purged with dry nitrogen for 15 minutes and then heated at 60° C. overnight. After cooling to room temperature, the solution was dialyzed against water overnight. The resulting polymer was subject to characterization and imaging testing.

Synthesis of Poly(vinyl Benzyl Thiosulfate Sodium Salt) from Polymer: Polymer 25

Vinyl benzyl chloride (21.5 g, 0.141 mol) and AIBN (0.25 g, 1.5 mmol) were dissolved in 50 ml of toluene. The solution was purged with dry nitrogen and then heated at 65° C. overnight. After cooling to room temperature, the solution was diluted to 100 ml and added dropwise to 1000 ml of isopropanol. The white powdery polymer was collected by filtration and dried under vacuum at 40° C. overnight.

This polymer (10 g) was dissolved in 150 ml of N,N'-dimethylformamide. To this solution was added sodium thiosulfate (10.44 g, 0.066 mol) and 30 ml of water. Some polymer precipitated out. The cloudy reaction mixture was heated at 95° C. for 12 hours. After cooling to room temperature, the hazy reaction mixture was dialyzed against water. A small amount of the resulting polymer solution was freeze dried for elemental analysis and the rest of the polymer solution was subject to imaging testing. Elemental analysis indicated the reaction conversion was 99 mol %.

Synthesis of Poly(2-sodium Thiosulfate-ethyl Methacrylate): Polymer 26

2-Chloroethyl methacrylate (10 g, 0.067 mol) and AIBN (0.11 g, 0.7 mmol) were dissolved in 20 ml of tetrahydrofuran. The solution was purged with dry nitrogen and then heated at 60° C. for 17 hours. After cooling to room temperature, the solution was diluted to 80 ml and added dropwise to 800 ml of methanol. The resulting white powdery polymer was collected by filtration and dried under vacuum at 40° C. overnight.

The above polymer (5 g) was dissolved in 50 ml of N,N'-dimethylformamide. To this solution was added sodium thiosulfate (5.3 g) and water (10 ml). Some polymer precipitated out. The cloudy reaction mixture was heated at 90° C. for 52 hours. After cooling to room temperature, the reaction mixture was dialyzed against water. A small amount of the resulting polymer solution was freeze dried for elemental analysis and the rest of the polymer solution was subject to imaging testing. Elemental analysis indicated that the conversion to sodium thiosulfate was 90 mol %.

Synthesis of Polymers 26–28: Synthesis of Poly(2-hydroxy-3-sodium Thiosulfate-propyl Methacrylate-co-2-(methacryloyloxy)ethyl acetoacetate) from Polymer: Polymer 28

Glycidyl methacrylate (20.8 g, 0.146 mol), (methacryloyloxy)ethyl acetoacetate (2.72 g, 0.013 mol), and AIBN (0.52 g) were dissolved in 110 ml of N,N'-dimethylformamide in a 250 ml round-bottomed flask capped with a rubber septum. The solution was purged with dry nitrogen for 15 minutes and then heated at 60° C. for 15 hours. The product was diluted with 20 ml of N,N'-dimethylformamide and purified by precipitated into 1200 ml of isopropanol. The resulting white powdery polymer was filtered and dried under vacuum at 40° C. overnight.

The above polymer (10 g) was dissolved in 150 ml of N,N'-dimethylformamide. To this solution were added sodium thiosulfate (11 g) and water (30 ml). Some polymer precipitated out. The cloudy reaction mixture was heated at 65° C. for 24 hours. After cooling to room temperature, the hazy reaction mixture was dialyzed against water. Small amount of the resulting polymer solution was freeze-dried for elemental analysis and the rest of the polymer solution was subject to imaging testing. Elemental analysis indicated complete conversion of glycidyl methacrylate to sodium thiosulfate salt.

Polymer 26 and 27 were similarly prepared.

Synthesis of Poly(4-aza-2-hydroxy-6-sodium thiosulfate-hexyl Methacrylate) from Monomer: Polymer 29

Sodium hydroxide (4.5 g 0.112 mol) and 2-aminoethanethio-sulfuric acid (8.85 g, 0.056 mol) were dissolved in 15 ml of water in a 100 ml round-bottomed flask and cooled in an ice bath. Glycidyl methacrylate (8 g, 0.056 mol) was dissolved in 15 ml of tetrahydrofuran and added slowly to the above solution, keeping the temperature below 25° C. The reaction was followed by thin layer chromatography. After the completion of the reaction, 4,4'-azobis(4-cyanovaleric acid) (75% in water, 0.52 g, 1.4 mmol) was added to the reaction flask. The flask was capped with a septum, purged with dry nitrogen for 15 minutes, and then heated at 60° C. for 17 hours. After cooling to room temperature, the solution was dialyzed against water overnight. The resulting polymer was subject to characterization and imaging testing.

Synthesis of IR Dyes:

Oxonol IR Dye 3 was prepared using the following synthetic scheme that is generally useful for all of the oxonol dyes described herein.

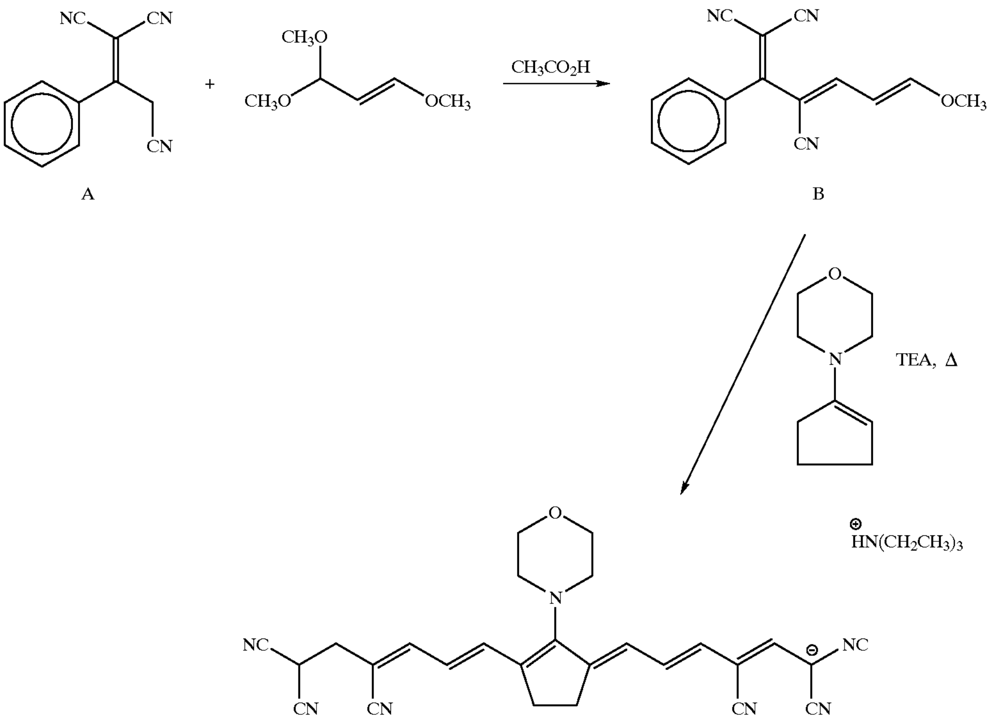

A

B

A sample of intermediate A (15 g, 0.077 moles) and trimethoxypropene (26.5 g, 0.2 moles) were added together to a 200 ml beaker containing acetic acid (60 ml). The solution was stirred mechanically using a overhead stirrer at room temperature. The suspension dissolved and as the solution was warmed slightly, it became green in color. As soon as the solution was homogeneous, a yellow solid began to precipitate from the solution. The reaction mixture was stirred an additional 2 hours before the yellow solid was collected by filtration. The solid was rinsed with acetic acid (I120 ml) and dried in a vacuum oven at 50° C. for 16 hours. The result was 17.5 g of solid intermediate B at 87% yield. NMR (300 Mhz, CDC13) dtms 7.5 (m, 4H), 7.3 (m, 2H), 6.25 (m, 2H).

A sample of intermediate B (15 g, 0.57 moles) was heated to boiling in acetonitrile (50 ml) in a 250-ml beaker on a hot plate. The reaction mixture was stirred mechanically and 4-(1-cyclopentenyl-1-yl)morpholine (Aldrich Chemical Co., 4.4 g, 0.28 moles) was added. Triethylamine (9.5 ml) was added to the solution and it immediately turned purple in color and then eventually green in color. The reaction mixture was heated an additional 15 minutes and then filtered while hot through a sintered glass funnel. A filtrate set up in the filter funnel and acetonitrile (50 ml) and water (10 ml) were added. The solution was again heated to boiling at which time the solids had dissolved. After 15 minutes, the solution was allowed to cool with stirring at room temperature. A solid precipitate formed that was collected by filtration. It was recrystallized from acetonitrile (90 ml) and water (10 ml). A green solid was collected and dried to give 10.6 g of IR Dye 3 at 50% yield. HPLC showed that the material was 99% pure. $\lambda_{max}$=815 nm ($CH_3OH$), e=13.7x$10^4$.

The following examples illustrate the practice of this invention and its advantages over embodiments outside of the scope of the invention. The invention is not to be construed as limited to these examples.

EXAMPLE 1 AND COMPARATIVE EXAMPLE 1

Imaging formulations 1 and 2 were prepared using the components (parts by weight) shown in TABLE I below.

TABLE 1

| Component | Formulation 1 (Comparative Example 1) | Formulation 2 (Invention Example 1) |
|---|---|---|
| Polymer 22 | 0.30 | 0.30 |
| IR Dye A | 0.06 | — |
| Oxonol IR Dye 1 | — | 0.03 |
| Water | 4.14 | 4.14 |
| Methanol | 4.50 | — |
| Acetone | — | 4.50 |

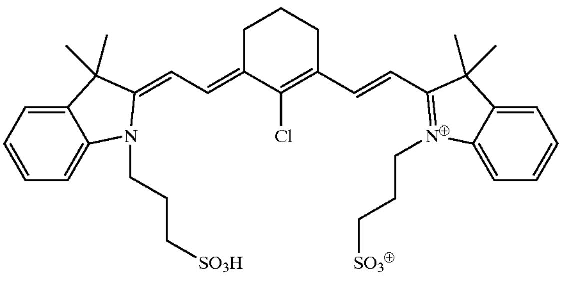

IR Dye A

Each formulation was coated at a dry coating weight of about 1.0 g/m$^2$ onto a grained phosphoric acid-anodized aluminum support. The resulting printing plate was dried in a convection oven at 82° C. for 3 minutes. Each imaging layer of the printing plate was imaged at 830 nm on a plate setter like the commercially available CREO TRENDSETTER™ (but smaller in size) using doses ranging from 360 to 820 mJ/cm$^2$. The imaging layer in Comparative Example 1 rapidly discolored to a tan color in the exposed regions producing an unmistakable sulfur odor during and after many hours following imaging. By contrast, the blue imaging layer in Example 1 produced a deeper blue image and the undesirable sulfur smell was clearly absent.

Each imaged plate was mounted on the plate cylinder of a commercially available full-page printing press (A. B. Dick 9870 duplicator) for a press run. A commercial black ink and Varn Universal Pink fountain solution (from Varn Products Co.) were used. The plate developed on press within 60 seconds of the press run. The on-press processed plates rolled up after 10 sheets and printed with full density and high image quality for at least 1,000 impressions. The Comparative Example 1 printing plate was judged to require 360 mJ/cm$^2$ of laser energy while the Invention Example 1 printing plate comprising oxonol IR dye 1 (at a 10:1 polymer:IR dye weight ratio and at 50% loading) required only 250 mJ/cm$^2$ of laser energy.

EXAMPLE 2

A printing plate of this invention was found to exhibit greatly reduced gaseous effluents upon imaging.

Identical plates were prepared as described in Example 1 except that the vacuum system of the plate setter was deliberately shut off during laser imaging. Samples of the two imaged plates (1000 mJ/cm$^2$ at 830 nm) were carefully placed inside special headspace vials immediately after laser imaging. Dynamic headspace analysis was carried out by purging with a stream of helium and condensing the effluents with liquid nitrogen. The trapped volatiles were identified by GC/MS instruments. The results are summarized in TABLE II indicate that gaseous effluents, especially sulfur-containing volatiles, were eliminated, or greatly suppressed by the use of the present invention.

TABLE II

| Volatile | Comparative Example 1 | Invention Example 1 | bp (° C.) |
|---|---|---|---|
| Chloromethane | trace | none | −24 |
| Carbon disulfide | large | at least 20x less | 46 |
| Carbonyl disulfide | large | at least 10x less | −50 |
| Methyl mercaptan | trace (fresh) none (3 days room temperature) | none none (3 days room temperature) | 6 |
| Methyl methacrylate | major | trace | 100 |
| Methyl styrene | trace | none | 170 |
| Vinyl benzaldehyde | trace | none | — |

EXAMPLE 3–7

Printing Plates Containing Other Oxonol IR Dyes

The following printing plates of this invention were prepared and used in printing as described above in Example 1. The imaging layers in the printing plates contained the oxonol IR dyes in TABLE III below. Each printing plate was successfully imaged without an unbearable sulfur smell and was used to produce 1,000 printed sheets of good quality on the A. B. Dick press.

TABLE III

| Example | IR Dye | Substituent $R_7$ group on Structure DYE | $\lambda_{max}$ (nm) | $OD_{830}$ | Photospeed (mJ/cm$^2$) | Cation[a] ($M^+$) |
|---|---|---|---|---|---|---|
| Comparative 1 | A | | 800 | 0.55 | 450 | None |
| Invention 1 | 1 | 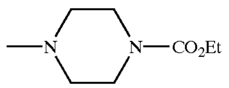 | 850 | 0.75 | <360 | $TMG^+$ |
| Invention 3 | 2 | 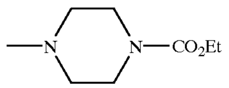 | 850 | 0.85 | <360 | $TEA^+$ |
| Invention 4 | 3 | 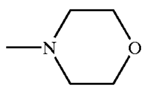 | 850 | 0.78 | <360 | $TEA^+$ |
| Invention 5 | 4 | 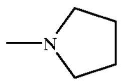 | 760 | 0.45 | 450 | $TEA^+$ |
| Invention 6 | 5 | 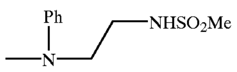 | 860 | 0.35 | <450 | $PyH^+$ |
| Invention 7 | 6 | | 840 | Not available | 450 | $TEA^+$ |

[a]$TMG^+$: tetramethylguanidinium ion, $TEA^+$: triethylammonium ion, $PyH^+$: pyridinium ion.

The invention has been described in detail with particular reference to preferred embodiments thereof, but it will be understood that variations and modifications can be effected within the spirit and scope of the invention.

We claim:

1. A heat-sensitive composition comprising:

a) a hydrophilic heat-sensitive ionomer, b) water or a water-miscible organic solvent, and c) an infrared radiation sensitive oxonol dye (IR dye) that is anionic in charge, has a polymethine chain conjugated with a cyclic or aliphatic group at each end, one of which his negatively charged, and is soluble in water or said water-miscible organic solvent, and has a $\lambda_{max}$ greater than 700 nm as measured in water or said water-miscible organic solvent, wherein said heat-sensitive ionomer is selected from the following three classes of polymers:

I) a crosslinked or uncrosslinked vinyl polymer comprising recurring units comprising positively-charged, pendant N-alkylated aromatic heterocyclic groups, II) a crosslinked or uncrosslinked polymer comprising recurring organoonium groups, and III) a polymer comprising a pendant thiosulfate group, and further wherein said Class I vinyl polymer is represented by the following Structure II:

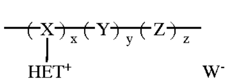

II wherein $HET^+$ represents said positively-charged, pendant N-alkylated aromatic heterocyclic group, X represents recurring units having attached $HET^{30}$ groups, Y represents recurring units derived from ethylenically unsaturated polymerizable monomers that provide active crosslinking sites, Z represents recurring units for additional ethylenically unsaturated monomers, x is from about 20 to 100 mol %, y is from 0 to about 20 mol %, z is from 0 to about 80 mol %, and $W^-$ is an anion.

2. The heat-sensitive composition of claim 1 wherein said IR dye has a $\lambda_{max}$ of from about 750 to about 900 nm as measured in water or said water-miscible organic solvent.

3. The heat-sensitive composition of claim 1 wherein said IR dye has a $\lambda_{max}$ of from about 800 to about 850 nm as measured in water or said water-miscible organic solvent.

4. The heat-sensitive composition of claim 1 wherein said IR dye has a polymethine chain that has at least 3 carbon—carbon double bonds.

5. The heat-sensitive composition of claim 4 wherein said IR dye has at least 5 carbon—carbon double bonds in said polymethine chain.

6. The heat sensitive composition of claim 1 wherein said IR dye is represented by either Structure DYE I or DYE II as follows:

DYE I:

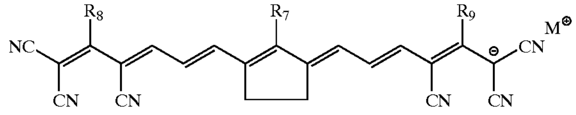

DYE II:

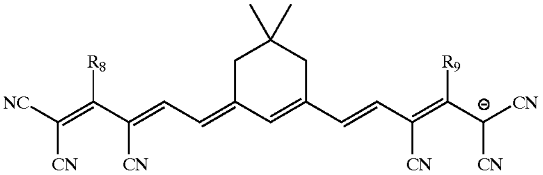

wherein $R_7$ is a secondary or tertiary amine, and $M^+$ is a monovalent cation, and $R_8$ and $R_9$ are independently heterocyclic or carbocyclic aromatic groups.

7. The heat-sensitive composition of claim 6 wherein $R_7$ is a secondary amine having at least one phenyl substituent, or $R_7$ is

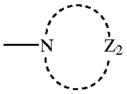

wherein $Z_2$ represents the carbon, nitrogen, sulfur and oxygen atoms necessary to complete a substituted or unsubstituted 5- or 9-membered heterocyclic group, and $R_8$ and $R_9$ are the same heterocyclic or carbocyclic aromatic group.

8. The heat-sensitive composition of claim 7 wherein each of $R_8$ and $R_9$ is a substituted or unsubstituted phenyl or naphthyl group.

9. The heat-sensitive composition of claim 6 wherein in reference to Structure DYE I, $R_8$ and $R_9$ are each a phenyl group and the IR Dye is:

| IR Dye | $R_7$ | $M^{\oplus}$ |
|---|---|---|
| DYE 29 | 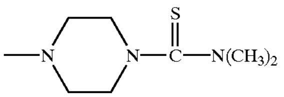 | $HN^{\oplus}(CH_2CH_3)_3$ |
| DYE 30 | 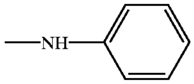 | $HN^{\oplus}(CH_2CH_3)_3$ |
| DYE 31 | 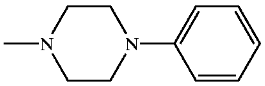 | $HN^{\oplus}(CH_2CH_3)_3$ |
| DYE 32 | 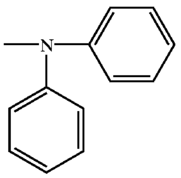 | $HN^{\oplus}(CH_2CH_3)_3$ |
| DYE 33 | 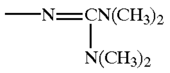 | $HN^{\oplus}(CH_2CH_3)_3$ |
| DYE 34 | 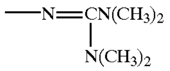 | 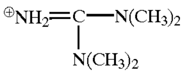 |
| or DYE 35 | 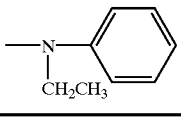 | $HN^{\oplus}(CH_2CH_3)_3$ |

10. The heat-sensitive composition of claim 6 wherein in reference to Structure DYE II, $R_8$ and $R_9$ are the same and the IR Dye is

| IR Dye | $R_8$ | $M^{\oplus}$ |
|---|---|---|
| DYE 36 | 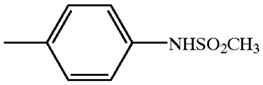 | $\overset{\oplus}{HN}(CH_2CH_3)_3$ |
11. The heat-sensitive composition of claim 1 wherein said IR dye is
DYE 1
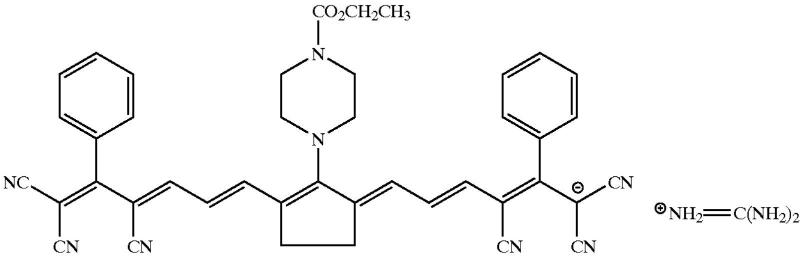
DYE 2
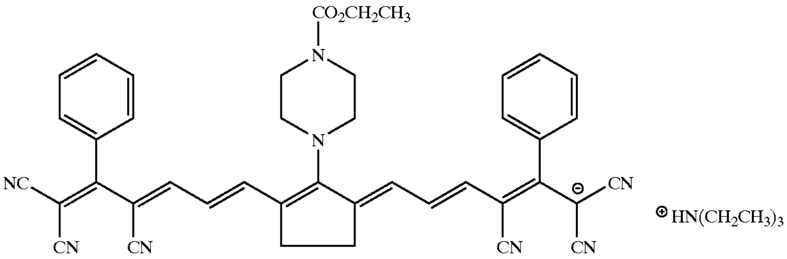
DYE 3
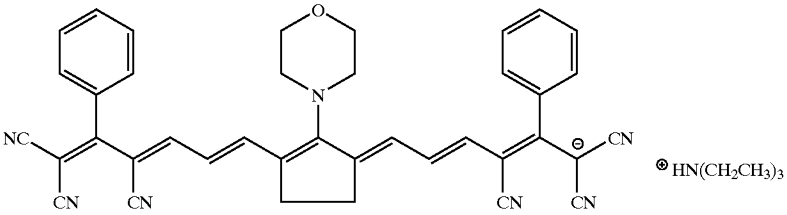
DYE 4
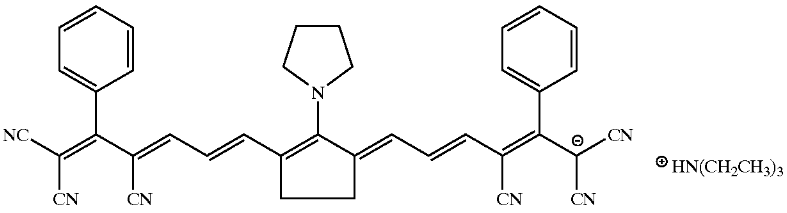
DYE 5
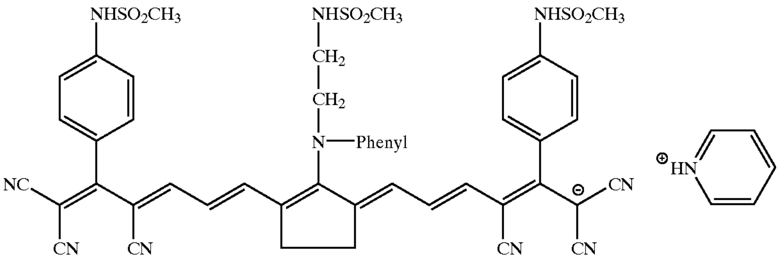

-continued
DYE 6
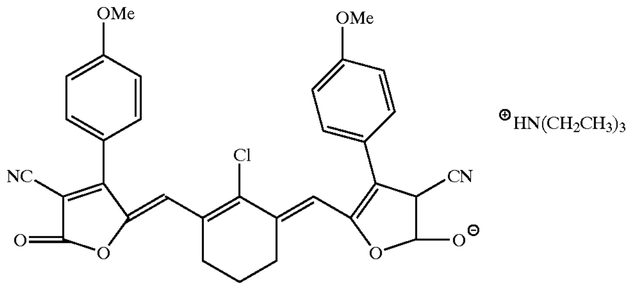
DYE 7
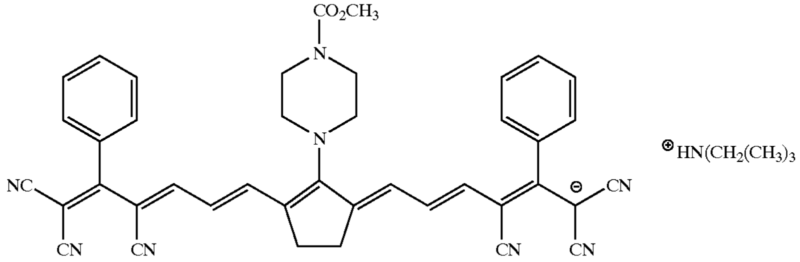
DYE 8
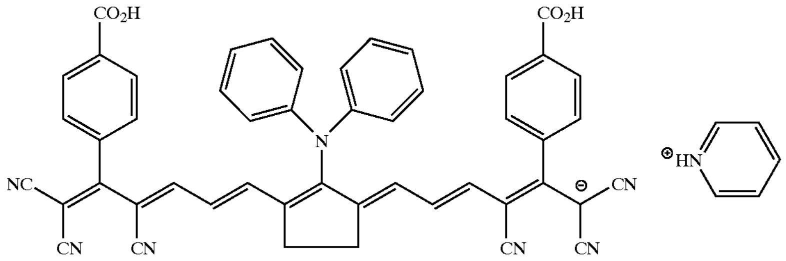
DYE 9
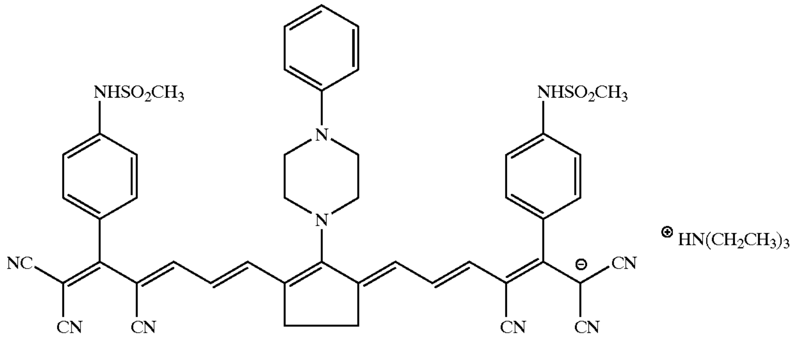
DYE 10
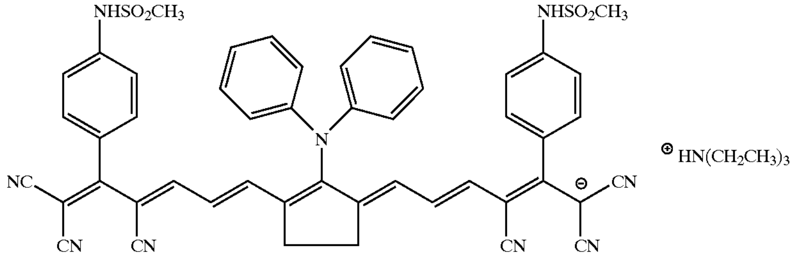

-continued
DYE 11
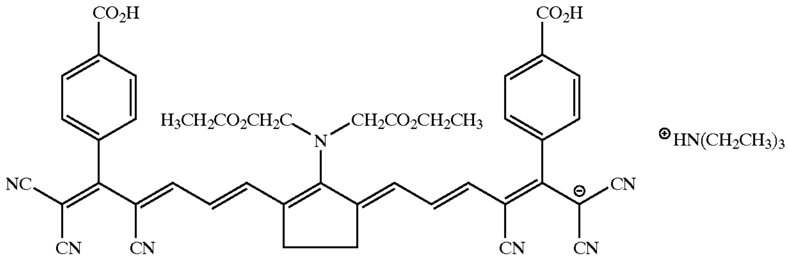
DYE 12
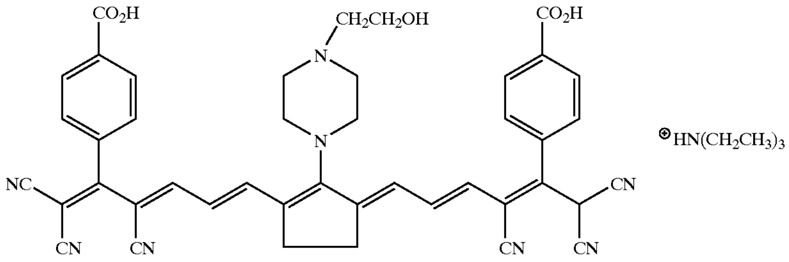
DYE 13
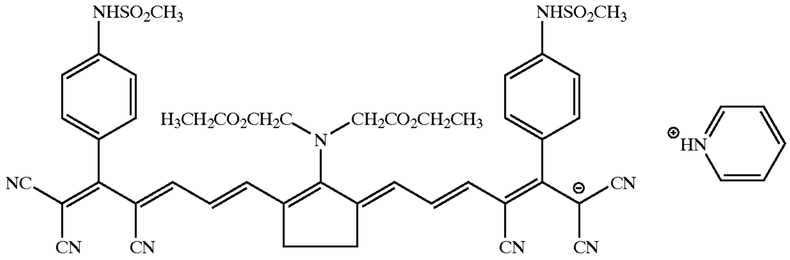
DYE 14
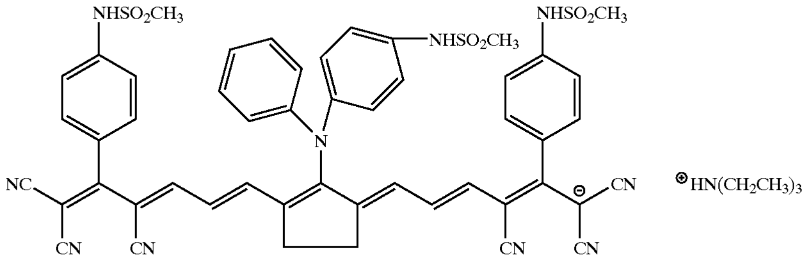
DYE 15
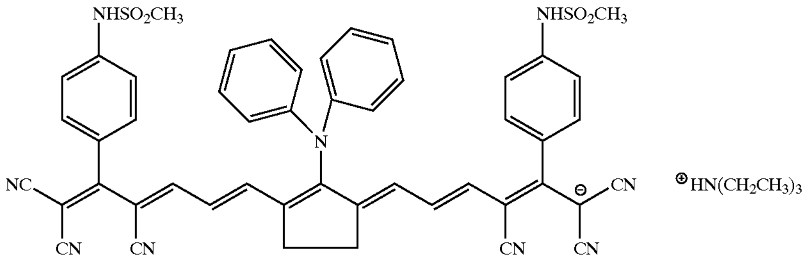
DYE 16
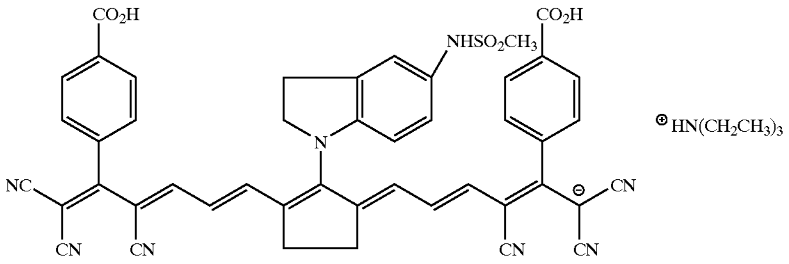

-continued
DYE 17
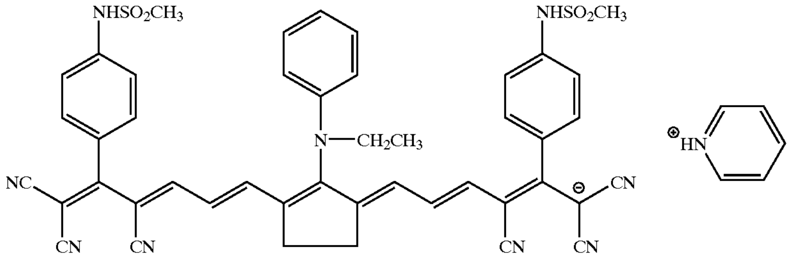
DYE 18
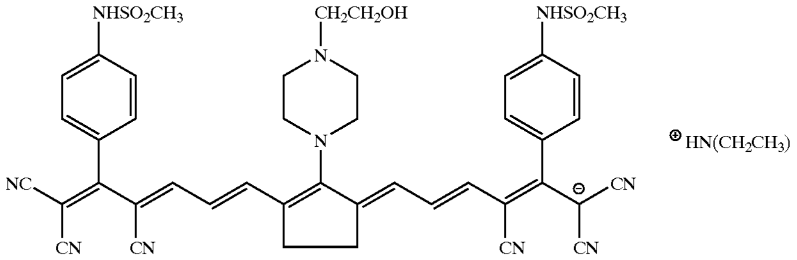
DYE 19
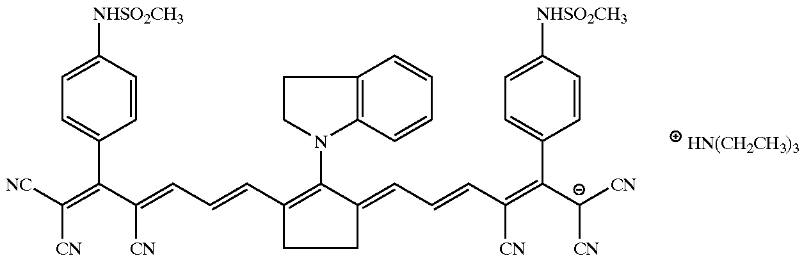
DYE 20
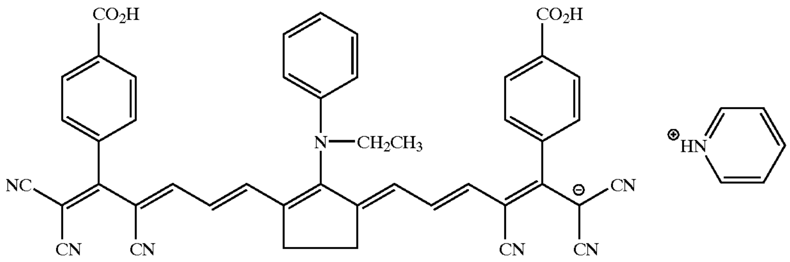
DYE 21
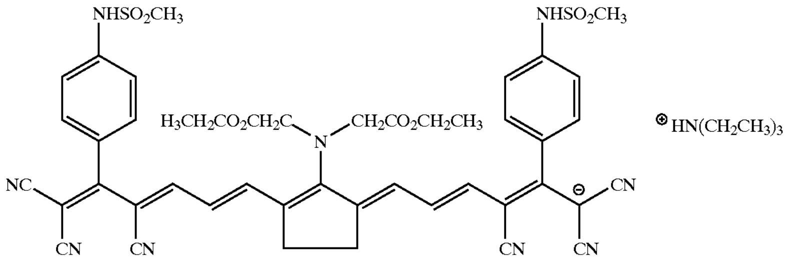

-continued
DYE 22
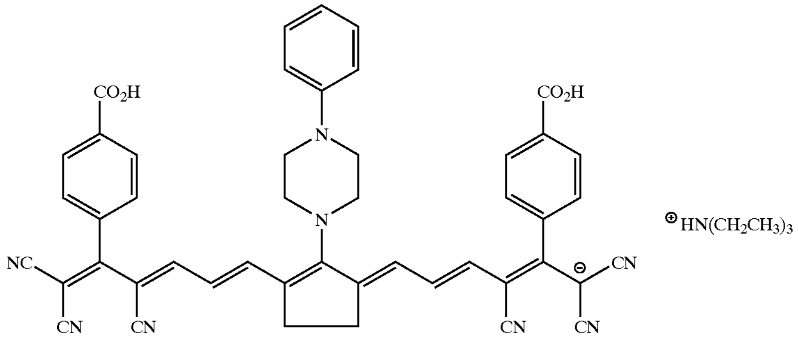
DYE 23
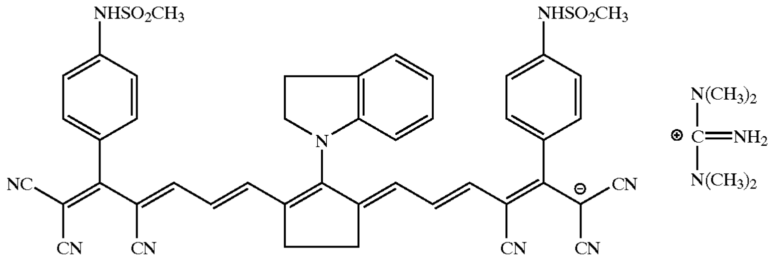
DYE 24
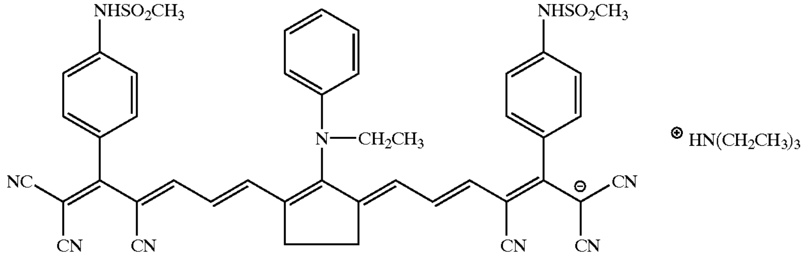
DYE 25
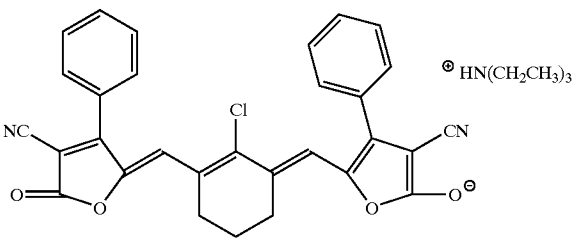
DYE 26
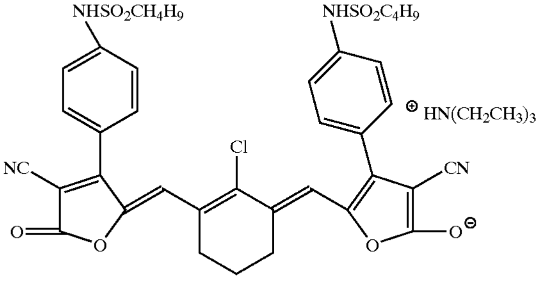
DYE 27
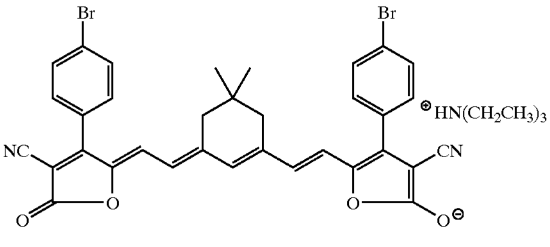
or
DYE 28
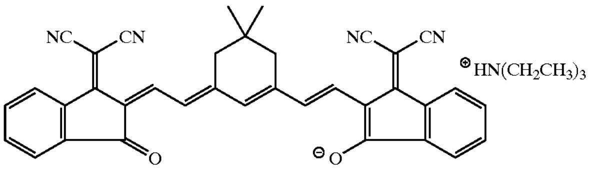

12. The heat-sensitive composition of claim 1 comprising water, methanol, ethanol, 1-methoxy-2-propanol, acetone, methyl ethyl ketone, acetonitrile, tetrahydrofuran, N-N-dimethylformamide, butyrolactone, or a mixture of two or more of these solvents.

13. The heat-sensitive composition of claim 1, wherein said heat-sensitive ionomer is a Class II vinyl polymer represented by either of Structures III, IV or V:

III

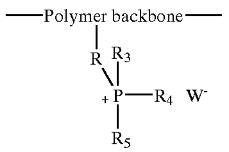

IV

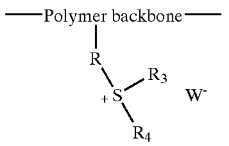

V

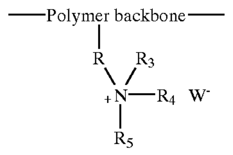

wherein R is an alkylene, arylene, or cycloalkylene group or a combination of two or more such groups, $R_3$, $R_4$ and $R_5$ are independently substituted or unsubstituted alkyl, aryl or cycloalkyl groups, or any two of $R_3$, $R_4$ and $R_5$ can be combined to form a heterocyclic ring with the charged phosphorus, nitrogen or sulfur atom, and $W^-$ is an anion.

14. The heat-sensitive composition of claim 1 wherein said Class II polymer is represented by the structure VI:

VI

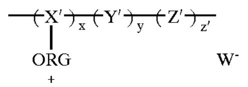

wherein ORG represents organoonium groups, X' represents recurring units to which the ORG groups are attached, Y' represents recurring units derived from ethylenically unsaturated polymerizable monomers that may provide active sites for crosslinking, Z' represents recurring units derived from any additional ethylenically unsaturated polymerizable monomers, x' is from about 20 to about 99 mol %, y' is from about 1 to about 20 mol %, and z' is from 0 to about 79 mol %.

15. The heat-sensitive composition of claim 1 wherein said heat-sensitive ionomer is a Class III polymer having the Structure VII:

VII

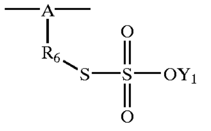

wherein A represents a polymeric backbone, $R_6$ is a divalent linking group, and Y is a hydrogen or a cation.

16. The heat-sensitive composition of claim 15 wherein $R_6$ is an alkylene group, an arylene group, an arylenealkylene group, or $—(COO)_n(Z_1)_m$ wherein n is 0 or 1, and $Z_1$ is an alkylene group, an arylene group, or an arylenealkylene group, and $Y_1$ is hydrogen, ammonium ion or a metal ion.

17. The heat-sensitive composition of claim 15 wherein $R_6$ is an alkylene group of 1 to 3 carbon atoms, an arylene group of 6 carbon atoms in the aromatic ring, an arylene alkylene group of 7 or 8 carbon atoms in the chain, or $—COO(Z_1)_m$ wherein $Z_1$ is methylene, ethylene or phenylene.

18. The heat-sensitive composition of claim 1 wherein said heat-sensitive polymer comprises ionic groups within at least 20 mol % of the polymer recurring units.

19. The heat-sensitive composition of claim 1 wherein said heat-sensitive polymer is present at from about 1 to about 10 weight %, and said IR dye is present at from about 0.2 to about 1 weight %.

20. A negative-working member comprising a support having disposed thereon a hydrophilic, heat-switchable imaging layer prepared from the heat-sensitive composition of claim 1.

21. The imaging member of claim 20 wherein said heat-sensitive ionomer is present in said imaging layer in an amount of at least 0.1 $g/m^2$, and said IR dye is present in said imaging layer in an amount sufficient to provide a transmission optical density of at least 0.1 when exposed to radiation having a $\lambda_{max}$ of 830 nm.

22. The imaging member of claim 20 wherein said support is an on-press printing cylinder.

23. A method of imaging comprising the steps of:

A)providing the negative-working imaging member of claim 20, and

B) imagewise exposing said imaging member to provide exposed and unexposed areas in the imaging layer of said imaging member, whereby said exposed areas are rendered more hydrophobic and lithographic printing ink receptive than said unexposed areas by heat provided by said imagewise exposure.

24. The method of claim 23 wherein said imagewise exposing is carried out using an IR radiation emitting laser, and said imaging member is a lithographic printing plate having an aluminum support or an imaging cylinder.

25. The method of claim 23 wherein said imagewise exposing is accomplished using a thermal head.

26. A method of printing comprising the steps of:

A)providing the negative-working imaging member of claim 20,

B) imagewise expo sing said imaging member to provide exposed and unexposed areas in the imaging layer of said imaging member, whereby said exposed areas are rendered more hydrophobic and lithographic printing ink receptive than said un exposed areas by heat provided by said imagewise exposure, and C) contacting said imagewise expos ed imaging member with a lithographic printing ink, and imagewise transferring said printing ink from said imaging member to a receiving material.

27. A method of imaging comprising the steps of:

A) spray coating the heat-sensitive composition of claim 1 onto a support to provide a negative-working imaging member, and B) imagewise exposing said imaging member to provide exposed and unexposed areas in the imaging layer of said imaging member, whereby said exposed areas are rendered more hydrophobic and lithographic printing ink receptive than said unexposed areas by heat provided by said imagewise exposure.

28. The method of claim 27 wherein said support is an on-press printing cylinder or sleeve.

* * * * *

UNITED STATES PATENT AND TRADEMARK OFFICE

CERTIFICATE OF CORRECTION

PATENT NO. : 6,423,469 B1
DATED : July 23, 2002
INVENTOR(S) : Thap DoMinh, Shiying Zheng and Kevin Williams It is certified that error appears in the above-identified patent and that said Letters Patent is hereby corrected as shown below:

<u>Column 11,</u>
Structure VI, correct to read:

--

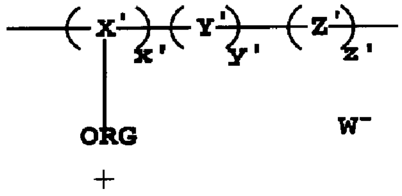

VI

--

<u>Column 53,</u>
Structure VI, correct to read:

--

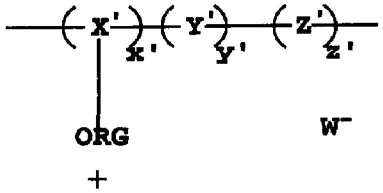

VI

--

Signed and Sealed this

Seventeenth Day of December, 2002

JAMES E. ROGAN
*Director of the United States Patent and Trademark Office*